US008995688B1

(12) United States Patent
Chemtob et al.

(10) Patent No.: US 8,995,688 B1
(45) Date of Patent: Mar. 31, 2015

(54) PORTABLE HEARING-ASSISTIVE SOUND UNIT SYSTEM

(71) Applicants: Helen Jeanne Chemtob, Silver Spring, MD (US); Gerald Cyrus Hershberger, Norfolk, VA (US)

(72) Inventors: Helen Jeanne Chemtob, Silver Spring, MD (US); Gerald Cyrus Hershberger, Norfolk, VA (US)

( * ) Notice: Subject to any disclaimer, the term of this patent is extended or adjusted under 35 U.S.C. 154(b) by 7 days.

(21) Appl. No.: 13/732,363

(22) Filed: Dec. 31, 2012

Related U.S. Application Data

(63) Continuation-in-part of application No. 12/507,796, filed on Jul. 23, 2009, now abandoned.

(51) Int. Cl.
*H03G 3/00* (2006.01)
*H04R 25/00* (2006.01)

(52) U.S. Cl.
CPC .................................... *H04R 25/55* (2013.01)
USPC ........................................ 381/109; 381/315

(58) Field of Classification Search
USPC .................... 381/312–321; 348/14.01–14.09
See application file for complete search history.

(56) References Cited

U.S. PATENT DOCUMENTS

| | | | | |
|---|---|---|---|---|
| 5,117,461 | A | 5/1992 | Moseley | |
| 5,426,706 | A | 6/1995 | Wood | |
| 5,487,067 | A | 1/1996 | Matsushige | |
| 6,212,496 | B1 | 4/2001 | Campbell et al. | |
| 6,381,308 | B1 | 4/2002 | Cargo et al. | |
| 6,466,678 | B1 | 10/2002 | Killion et al. | |
| 6,606,111 | B1 * | 8/2003 | Kondo et al. | 348/14.01 |
| 6,620,094 | B2 | 9/2003 | Miller et al. | |
| 6,647,123 | B2 | 11/2003 | Kandel et al. | |
| 6,651,040 | B1 | 11/2003 | Bakis et al. | |
| RE38,405 | E | 1/2004 | Clair, Jr. et al. | |
| 6,748,095 | B1 | 6/2004 | Goss | |
| 6,766,290 | B2 * | 7/2004 | Grau | 704/211 |
| 6,778,674 | B1 | 8/2004 | Panasik et al. | |
| 6,885,752 | B1 | 4/2005 | Chabries et al. | |
| 7,110,552 | B1 | 9/2006 | Saliterman | |
| 8,036,343 | B2 * | 10/2011 | Schulein et al. | 379/52 |
| 2002/0076072 | A1 | 6/2002 | Cornelisse | |
| 2004/0133066 | A1 | 7/2004 | Mann et al. | |
| 2004/0240650 | A1 * | 12/2004 | Bear et al. | 379/142.01 |
| 2005/0089183 | A1 | 4/2005 | Niederdrank et al. | |
| 2005/0122389 | A1 * | 6/2005 | Miao | 348/14.01 |
| 2006/0013420 | A1 | 1/2006 | Sacha | |
| 2006/0067550 | A1 | 3/2006 | Puder et al. | |
| 2008/0232605 | A1 | 9/2008 | Bagda | |
| 2011/0103613 | A1 | 5/2011 | Van Der Werf et al. | |

FOREIGN PATENT DOCUMENTS

WO 01/89263 A 11/2001

* cited by examiner

*Primary Examiner* — Curtis Kuntz
*Assistant Examiner* — Sunita Joshi
(74) *Attorney, Agent, or Firm* — Swift & Swift; Stephen Christopher Swift

(57) ABSTRACT

A system consisting of interconnectible, hearing-assistive, portable "units" which can address communication problems that persons who are hard of hearing experience in many social settings (such as while dining out with friends in a noisy restaurant). The system allows each unit operator to share multiple audio input signals coming into any of the connected units with the other participants using the system. The operator is also able to selectively amplify one or more of the incoming audio signals (such as from the voices of one or more of the participants) while blocking out or turning down another (such as from background music). The units are capable of integrating audio signals with video, word processing and internet data. An innovative method for improving communication for persons who are hard of hearing in public and private settings is also claimed.

19 Claims, 19 Drawing Sheets

DIAGRAM OF TWO HARD OF HEARING (HOH) PERSONS AND OTHER PARTICIPANTS TALKING AND WATCHING TELEVISION TOGETHER WHILE USING THE SYSTEM

DIAGRAM OF PERSONS WHO ARE HARD OF HEARING (HOH) AND THOSE WHO HAVE ORDINARY HEARING (OH) USING THE SYSTEM OF INTER-CONNECTED UNITS WHILE DINING IN A NOISY RESTAURANT

DIAGRAM OF ELECTRICAL CIRCUITS INSIDE INTER-CONNECTED UNITS FROM FIG. 1
SHOWING TRANSMISSION OF AUDIO INPUTS BETWEEN TWO OPERATORS OF THE CONNECTED COMPLETE UNITS

DIAGRAM OF ELECTRICAL CIRCUITS INSIDE ONE COMPLETE UNIT AND ONE CONTROLS ONLY UNIT FROM FIG. 1 SHOWING TRANSMISSION OF AUDIO INPUTS BETWEEN UNITS

Controls Panel Illustration for Inputs "a" Through "d" on Complete Unit

Diagram of Electrical Circuits and Controls for Sub-grouping and Blocking Functions During a Specific Interaction DIAGRAM OF HARD OF HEARING (HOH) PERSON, HER FRIEND WITH ORDINARY HEARING (OH) AND HER DOCTOR (HOH) USING THE SYSTEM TO TALK AND REVIEW RESULTS OF ECHO-CARDIOGRAM TEST DIAGRAM OF TWO HARD OF HEARING (HOH) PERSONS AND OTHER PARTICIPANTS TALKING AND WATCHING TELEVISION TOGETHER WHILE USING THE SYSTEM DIAGRAM OF ONE HARD OF HEARING (HOH) OPERATOR WATCHING TELEVISION WITH A FRIEND USING ONE COMPLETE UNIT WITH SPECIAL SOUND TRACK SEPARATOR ELEMENT DIAGRAM OF ONE HARD OF HEARING (HOH) OPERATOR USING ONE COMPLETE UNIT TO TALK WITH A FRIEND IN THE ROOM AND TO TAKE A CALL FROM A CELL PHONE CALLER AT THE SAME TIME DIAGRAM OF ONE HARD OF HEARING (HOH) OPERATOR USING ONE COMPLETE UNIT TO TALK OVER THE TELEPHONE WITH HIS DOCTOR AND AN INTERPRETOR, AND WITH A FRIEND PRESENT IN THE ROOM WHO IS HELPING HIM WITH THE CALL DIAGRAM OF CONTROL MODULE FOR COMPUTERIZED UNIT WITH SCREEN, KEYBOARD AND MICROPROCESSORS DIAGRAM OF TWO HARD OF HEARING (HOH) OPERATORS OF COMPLETE UNITS, ONE WITH SCREEN, KEYBOARD AND COMPUTERIZED OPERATIONS, BEING USED TO WATCH A MOVIE WHILE TALKING TOGETHER DIAGRAM OF PERSON WHO IS HARD OF HEARING (HOH) USING THE SYSTEM AT A LECTURE HALL TO LISTEN TO A SPEAKER GIVING A POWERPOINT PRESENTATION AND TO TALK WITH OTHER ATTENDEES DIAGRAM OF PERSONS WHO ARE HARD OF HEARING (HOH) AND PERSONS WITH ORDINARY HEARING (OH)
USING THE TABLE TOP UNIT FOR A TELECONFERENCING SESSION IN A BUSINESS SETTING

Diagram of Persons Using Table Top System with Computerized Units Having Screens, Keyboards and Microprocessors Located Around a Conference Table

DIAGRAM OF ONE HARD OF HEARING (HOH) OPERATOR OF A COMPLETE UNIT BEING USED IN A NOISY WORK SETTING REQUIRING USE OF PHONE, FACE TO FACE AND INTERCOM COMMUNICATIONS

USE OF SYSTEM IN THEATER WITH FIXED INPUTS

Operation of Hearing-Assistive Sound Unit System in Vehicle

HEARING-ASSISTIVE TECHNOLOGY CO-LOCATED AND/OR EMBEDDED IN OTHER COMMUNICATION AND TECHNOLOGICAL DEVICES

PORTABLE HEARING-ASSISTIVE SOUND UNIT SYSTEM

CROSS REFERENCE TO RELATED APPLICATION

This application is a Continuation-In-Part of United States Regular Utility patent application Ser. No. 12/507,796, filed on Jul. 23, 2009, which is incorporated herein by reference.

BACKGROUND OF THE INVENTION

1. Field of the Invention

The present invention relates to an electronic communication system made up of interconnectible portable devices called "portable hearing-assistive sound units" that are capable of enhancing the listening and communication experience of users, especially those users who are hard of hearing, in a variety of settings.

Each device or "unit" is not worn in or near the ear, as conventional hearing aids are worn, but is positioned at an arm's reach distance from the user's body, from which position it transmits audio signals to the user's ear via wireline or wireless headphones.

2. Description of the Prior Art

U.S. Pat. No. 5,117,461, issued on May 26, 1992, to William T. Moseley, discloses a device for performing electroacoustic functions, that can act as a hearing aid and provide a headset for home entertainment equipment.

U.S. Pat. No. 5,426,706, issued on Jun. 20, 1995, to William H. Wood, discloses a remote simultaneous interpretation system, designed to enable a doctor and patient who do not speak a common language to communicate using headsets connected to an interpreter at a different location.

U.S. Pat. No. 5,487,067, issued on Jan. 23, 1996, to Takashi Matsushige, discloses a data communications apparatus, with a master device for processing audio data, and a variety of slave devices connected in a ring network with the master device.

U.S. Pat. No. 6,212,496, issued on Apr. 3, 2001, to Lowell Campbell and Daniel Robertson, discloses a method and apparatus for customizing audio output to a user's hearing in a digital telephone, by adjusting the input signal.

U.S. Pat. No. 6,381,308, issued on Apr. 30, 2002, to Charles H. Cargo, James M. Larson and Gerald P. Mill, discloses a device for coupling a hearing aid to a telephone.

U.S. Pat. No. 6,466,678, issued on Oct. 15, 2002, to Mead C. Killion et al., discloses a hearing aid in which the sound is processed by digital damping.

U.S. Pat. No. 6,647,123, issued on Nov. 11, 2003, to Gillray L. Kandel and Lee E. Ostrander, discloses a signal processing circuit and a method for increasing speech intelligibility.

U.S. Pat. No. 6,651,040, issued on Nov. 18, 2003, to Raimo Bakis et al., discloses a method for dynamic adjustment of audio input gain in a speech system.

U.S. Pat. No. 6,620,094, issued on Sep. 16, 2003, to Douglas Alan Miller, et al., discloses a system of adjusting sound inputs into a hearing aid by using an interface that provides direct delivery of audio input from external wire-line and wireless sources to the speech processor of the hearing aid.

U.S. Pat. No. 6,748,095, issued on Jun. 8, 2004, to Raymond G. Goss, discloses a headset with multiple connections.

U.S. Pat. No. 6,778,674, issued on Aug. 17, 2004, to Carl M. Panasik et al., discloses a hearing assist device with directional detection and sound modification.

U.S. Pat. No. 6,885,752, issued on Apr. 26, 2005, to Douglas Melvin Chabries et al., discloses a hearing aid incorporating signal processing techniques to filter out background noise, to make it easier for the user to understand persons speaking to him or her.

U.S. Pat. No. 7,110,552, issued on Sep. 19, 2006, to Mark Saliterman, discloses a personal listening device for arena events, wherein sound is received at various locations and transmitted to a user's headphones.

U.S. Pat. No. RE 38,405, reissued on Jan. 27, 2004, to Roy Barry Clair, Jr. and Ronald D. Borthwick, discloses an enhanced concert audio system, including a portable unit (with headphones and a receiver) to be carried by a user.

U.S. Patent Application Publication No. 2002/0076072, published on Jun. 20, 2002, to Leonard E. Cornelisse, discloses software implemented loudness normalization for a digital hearing aid.

U.S. Patent Application No. 2004/0133066, published on Jul. 8, 2004, to Alfred E. Mann et al., discloses an implant placed under the skin near the ear which includes an external module having a microphone which sends transmissions from the module to the implant.

U.S. Patent Application No. 2005/00899183, published on Apr. 28, 2005, to Torsten Niederdrank and Gottfried Ruckert, discloses a wireless communication system between hearing aids worn by the same person and an external module that improves the system's ability to set priorities.

U.S. Patent Application Publication No. 2006/0013420, published on Jan. 19, 2006, to Michael Karl Sacha, discloses a hearing aid that can be automatically switched from the microphone (acoustic input) mode to the telephone voice coil pickup without the user having to manually make the switch.

U.S. Patent Application No. 2006/0067550, published on Mar. 30, 2006, to Henning Puder and Andre Steinbuss, discloses a system of signal transmission between hearing aids, wherein the signal received by the first person's hearing aid is wirelessly sent to the second person's hearing aid at a further distance from the sound source, and so on until the signal is sent back to the first person's hearing aid, creating a circuit which clarifies the signal for all the hearing aids in the circuit.

U.S. Patent Application Publication No. 2008/0232605, published on Sep. 25, 2008 by Merat Bagda, discloses a system of improving hearing through a specially equipped auscultation device in the form of a stethoscope.

U.S. Patent Application Publication No. 2011/0103613, published on May 5, 2011 by Erik Cornelis Diederik Van Der Werf and Nikolai Bisgaard, discloses a hearing aid that can filter out different types of sounds.

International Patent Application WO 2001/0189263 A, filed under the Patent Cooperation Treaty, published on Nov. 22, 2001, to Chang Chun, discloses a bone conduction and sound amplifying hearing aid in the form of a headset with a portable unit.

None of the above inventions and patents, taken either singly or in combination, is seen to describe the instant invention as claimed.

Section I. The Need for New Technology to Improve the Communication Experience of Persons Who are Hard of Hearing in a Variety of Settings:

As people get older, there is an increasing possibility that they may become hard of hearing. This is currently a growing problem in the United States as the people of the baby boom generation have entered their 50s and 60s. Advancements in hearing aids have helped some people who have become hard of hearing to continue to be able to function in the hearing world. However, hearing aids have only been minimally successful in addressing the problems facing those who are hard of hearing in a variety of settings.

Following is a discussion of: A) The problems facing people who are hard of hearing in a number of settings; B) The marked improvements and innovative solutions that the portable hearing-assistive sound unit system of the present invention brings to effectively addressing each of the problems facing hard of hearing people in each of the described settings; and C) A review of the hearing-assistive technology of the prior art (including hearing aids) that has addressed these problems with minimal success, especially when compared to the portable hearing-assistive sound unit system of the present invention.

a) Problems while Talking in a Noisy Restaurant:

One of the main problems with conventional hearing aids is that they do not do a good job of selectively amplifying the volume of certain sound inputs while turning down the volume of others. So a person with a hearing aid might have trouble hearing a friend who is speaking to her in a crowded restaurant because all the background noise in the restaurant is amplified by the hearing aid along with her friend's voice. It can be difficult for even a person who is not hard of hearing to tune into one speaker's voice among many and to tune out background music or the voices of other conversations. It can also be difficult for the person of ordinary hearing to talk with a person who is hard of hearing in a noisy setting because raising the volume of one's voice so that the hard of hearing person can understand what is being said can be disruptive to other people sitting nearby who are not involved in the conversation. Finally, it is extremely difficult for the hard of hearing person, even when wearing hearing aids, to engage in a conversation with a subset of the people with whom he/she is dining while other conversations are going on at the same time.

What is needed to effectively address the problems facing the hard of hearing person in this setting is the portable hearing-assistive sound unit system of the present invention. The system consists of interconnectible, portable devices or "units"; with each unit being capable of transmitting multiple audio signals at the same time which can be shared by all persons using any one of the connected units; and with the person operating the controls of any of the connected units having the capacity to differentially and easily adjust the volume of each audio signal coming into any of the connected units as frequently as desired, over the duration of the interaction.

Ideally, when using the system of the present invention, all persons who are connected to one of the hearing-assistive units speak into a microphone contained in a headset (microphone combined with headphones). The audio signal from each user's microphone (as well as audio inputs from sources other than user voices, such as audio signals from a television set) can be inputted into any of the connected portable sound units. Each incoming audio input signal is routed by electrical circuit through an amplifier which is connected to a set of controls which allow each user to adjust the volume of each incoming audio input signal relative to the other audio input signals, to his/her liking. The electrical circuit continuously routes the volume-adjusted audio signals created by each user (through operation of his/her respective set of controls) through a "sound combiner" (which can be a device, circuit or software program). The sound combiner creates a separate set of volume-adjusted audio signals for each user, with each user's set of audio signals representing the specific adjustments made by him/her. The separate set of volume-adjusted audio signals is then routed from the unit to each user's headphones. The headphones allow each user of the connected units to listen to the combined volume-adjusted audio signals he/she has created in real-time throughout the duration of use, while effectively blocking out background noise.

There are several features of the present invention that make it highly effective in addressing the problems the hard of hearing person experiences when having dinner with friends in a noisy restaurant. Because an audio input signal is created by each user when speaking into his/her microphone, and because the system allows each user to separately adjust the volume of each of the voice input signals coming into any of the connected units, the hard of hearing user is able to turn the volume of certain voices up, and the volume of other voices down, depending upon which persons he/she is talking with at any particular moment. Therefore, the hard of hearing user of the system can have a conversation with one or two of the people at the dining table, while others are having a different conversation. At a later time, when all the people at the table decide to engage in one conversation all together, then the hard of hearing user can easily turn up the volume for each of the voice inputs coming into any of the connected units and participate in the conversation with the whole group.

The system also addresses some other problems that can arise when dining out in a noisy restaurant. For example, if the hard of hearing user would like to speak with the waiter, then the waiter can use one of the microphones to plug into one of the units and answer questions about specials, etc., and the hard of hearing users of the system can hear this clearly even in a very noisy restaurant. Another big advantage of using the system in this setting is that persons of ordinary hearing do not have to raise their voices to uncomfortable levels in order to be heard by the hard of hearing persons involved in the conversation. Finally, the system can address the problem of needing to answer a phone call while dining, but not wanting to disturb the other people at the table by taking the call. The system allows the unit operator to block his/her phone conversation with the rest of the diners while talking on the phone and using the hearing-assistive features of the system.

b) Problems while Traveling in the Car:

Another setting that poses some serious problems for the hard of hearing person is traveling in the car with other people. The noise from traffic while traveling in a vehicle can make it difficult even for people of ordinary hearing to carry on a conversation. The present invention can provide a highly effective solution for this problem. By having all persons traveling in the vehicle together with the hard of hearing unit operator "plug in" to a complete unit, and by having all the persons involved in the interaction wear headsets (with combined headphones and microphone), a "closed circuit" of shared audio inputs is created. The hard of hearing operator can adjust the volumes of each of the audio inputs into the unit. This makes it possible for him/her to turn up the volume of the voice inputs as loudly as desired, without disturbing any of the other passengers in the vehicle, and without needing anyone to raise the volume of his/her voice to uncomfortable levels in order to be heard. The hard of hearing person's headphones would block out noise from traffic and he/she could adjust the volume of the voices to "tune in" to the persons with whom he/she wants to communicate and "tune out" those speakers who are having a different conversation. If the hard of hearing person happened to be driving, he/she could still hear external sounds coming from outside the vehicle via an omni-directional microphone that can be embedded in the unit. This is an important optional feature, since it is necessary when driving to be able to attend to other sounds from outside the vehicle, such as another driver honking the horn or a fire truck or ambulance sounding its alarm.

Another problem that can be addressed when using the system while traveling in a vehicle is the following: It can be very hard to get the hard of hearing person's attention, especially if he/she is wearing headphones while listening to music or talking to someone in the vehicle. The units of the present system can be equipped with lights (or beeps) on the control panel that indicate when someone who is connected to one of the units would like to interrupt the hard of hearing person or to join in on an ongoing conversation with him/her. Another advantage of using the system of the present invention is that cell phone calls can be integrated into the operations of the units, making it possible for the passenger or driver using the system to answer a phone call without having to interrupt the other people involved in a conversation, or having to disconnect from the ongoing interaction. The control panel on the unit may optionally provide lights (or beeps) indicating that the operator of the unit is receiving an incoming phone call. The wireless receptor on the unit for incoming cell phone calls receives the signal and then the signal gets routed through the unit through the amplifier and to the operator's headphones. The unit can block out the other activity occurring within the system (conversations, music, etc.) so that they cannot be heard while he/she is talking to the cell phone caller.

c) Problems Hearing in Teleconferences and Business Meetings:

Another setting that can be particularly difficult for the hard of hearing person is participating in business meetings or teleconference calls at work. The present system makes it possible for the hard of hearing user to attend a teleconference or business meeting involving a number of people, including some who are physically present with him/her, some who are calling in from cell phones, and some who are connecting via video internet transmission. A special form of the present invention, the table top unit, allows for multiple inputs to be processed and for multiple units to be connected together, thereby providing the means for a number of hard of hearing users to separate out the voices of individual callers and of persons who are physically present in the room, and to differentially adjust the volume of each input as desired. Another optional feature to the system is providing a means for subgrouping and blocking out the other inputs not involved in the subgroup, so that the hard of hearing user can have a "private" conversation with a subgroup while still maintaining his/her connection with the whole group of participants in the call. This feature helps the system to be very adaptive to the kinds of meetings and conference calls that often occur in businesses today. Specifically, it gives the hard of hearing user the ability to talk with a few other persons while other people are having a different conversation, but then rejoin the whole group when desired.

The system of the present invention can also be helpful in office settings for holding business meetings with hard to hear persons who are physically present or connecting to the meeting through an internet connection. Specifically, the table top system can be embedded in a large meeting table with connections to laptop computers made available for every person at the meeting table, and with said computers being programmed to work in synchronous operation with the hearing-assistive technology of the present invention. That is, the set of volume-adjusted inputs into the table top unit created by each user is sent from the unit to each person's computer, where each operator can control the volume of the audio inputs and engage in subgrouping of conversations when desired.

d) Problems while Working in Noisy Environments:

It is important to realize that many people in the work force, as well as patrons, are hard of hearing or could become hard of hearing. The personal sound system units of the present invention allow hard of hearing workers to continue working in jobs requiring ongoing communication with customers and other sources of audio input. For example, a hard of hearing doctor could provide his patients with a microphone connection into his/her personal sound system unit and be able to hear the patient with greater clarity.

Anyone who has tried to talk to someone behind the ticket counter in an airport knows how hard it is to hear above the din of airplanes taking off and crowds of people pushing their way up to the counter, and multiple announcements overhead about cancelled flights and security warnings. The present invention could be very helpful to the hard of hearing airport ticket counter worker in this setting. He/she could have the customers speak into a microphone plugged into his/her unit so that he/she could hear their voices clearly even in the very noisy airport setting. His/her unit could also include inputs from other ticket workers, incoming telephone calls or the intercom system so that he/she would not miss out on other important communications from co-workers or from telephone contacts. The system of the present invention could provide an excellent opportunity for employers to make reasonable accommodations to hard of hearing workers as required by the Americans With Disabilities Act ("ADA").

e) Problems while Visiting a Sports Arena:

Another setting which can pose difficulties for the hard of hearing user is at a sports arena. The system of the present invention can address these difficulties by allowing the hard of hearing person to hear an announcer in a sports arena while talking to persons nearby and blocking out the noise from the crowds. The system accomplishes this by having separate inputs for the wireless announcer's signal, for the voices of other people with whom he/she wants to talk in the arena, and even an input for an incoming cell phone call, while the user wears his/her headphones, thereby blocking out background noise.

f) Problems when Using Other Technological Devices and Interacting with Others:

The hard of hearing person can experience problems when he/she must communicate with others while using various communications devices and computer applications with other people. It can be a serious problem for the hard of hearing person to be able to participate with other people when searching the internet or listening to music while talking. The present invention can allow the hard of hearing person to utilize the hearing-assistive features of the system while accessing the internet with other people. This can be accomplished by inputting the audio signal from the computer or personal digital assistant ("PDA") into the user's unit, or by embedding the hearing-assistive technology of the unit into another device (such as a DVD player, computer or smart phone). In addition, the system of the present invention can allow the users to access their music via radios, stereos, or IPOD's while using the system. Specifically, the hard of hearing user can listen to music and talk with specific others connected to the system nearby, or he/she can take an incoming phone call from outside while continuing to remain connected to the ongoing activity occurring with the system.

The portable sound units of the present invention can be equipped with a mini-screen from which photos, videos and internet material can be projected and shared among those people communicating with the system. This feature would be especially useful as many people are transmitting digital photographs and music downloads, which could be shared by groups of people, including those who are hard of hearing or deaf. The hard of hearing user can turn the volume of voice inputs up when desired, and the volume of music or other inputs up or down as well. This feature is highly desirable when the units are used in work settings as well. In addition, the units can be equipped with screens, keyboards and microprocessors which allow for the integration of the hearing-assistive capabilities of the system with other wireless multimedia devices, including cell phones, computers, teleconferencing, online meeting systems, PDA's, IPOD's and smart phones. These features make it possible for the hard of hearing person to participate completely in many diverse and public settings.

g) Problems while Attending a Lecture:

The hard of hearing university student must face serious problems when attending lectures in large auditoriums. Oftentimes, professors give lectures while speaking into a microphone, as they also point to a screen displaying a POWERPOINT presentation. When the student is attending one of these lectures, it is often difficult to hear the professor speaking above all of the other noises coming from the room (such as people coughing and papers rustling). However, the hard of hearing student using the system of the present invention can effectively address all of these problems. Specifically, he/she can plug the sound from the lecturer's microphone directly into his/her unit (or pick up the lecturer's voice using one of the unit's microphone connections). Then he/she can turn the volume of the lecturer up while his/her headphones block out other noises in the auditorium. The hard of hearing user can also plug in the person seated next to him/her allowing them to talk in a quiet tone so as not to disturb others, but still being able to hear what is being said.

Another problem that the hard of hearing student may face is having to integrate oral and written and visually presented material. It is sometimes necessary to write some things down when communicating with a person who is deaf or hard of hearing. An important additional feature of this invention is providing a means for persons involved in a conversation with a hard of hearing or deaf person to integrate oral and written communication in a way to enhance the communication experience for everyone involved in the conversation. As discussed previously, the system of the present invention can optionally be equipped with a small screen and keyboard (like those provided in PDA's), along with the computer software needed to allow for communication via oral, written and visually presented material.

For an illustration of this feature, imagine that a person of ordinary hearing is trying to give directions for how to make a special cake to another person who is hard of hearing. To avoid any miscommunication, the person giving the directions could type out certain essential details, such as "3 tablespoons of sugar and 1 teaspoon of salt" while he/she continues to speak through the unit. In this case the written communication provides clarification. When the hard of hearing student attending a lecture needs clarification regarding what he/she has heard, he/she could write down a question by using the keyboard, such as, "I did not hear what the name of the city was. Did you?" Then the person helping the student could write down the answer. In addition, the hard of hearing student could have a videocamera recording the POWERPOINT presentation (or input the presentation directly into her unit, if possible), and then take notes to go along with each slide as desired. Finally, an optional feature of the system allows the hard of hearing user to record lectures with different inputs (such as the microphone from the lecturer, the voice of a "tutor", the slide presentation, the notes taken throughout the lecture) and synchronize them with the hearing-assistive features of the unit, so that the hard of hearing person can replay the lecture at a later time in order to listen again for better comprehension.

h) Problems while Watching Television with Others:

Sometimes the hard of hearing person chooses to use headphones to listen to the television or stereo so that he/she can turn up the volume on the TV and block out other background noise. This connection allows the hard of hearing person to turn the volume way up without disturbing other people. The problem with this approach is that watching television is often a social activity—people are talking while they watch TV together. So if the hard of hearing person is listening to the TV via headphones, then he/she cannot hear the other person who is watching TV with him/her. The present invention addresses this problem by allowing the hard of hearing person to listen to both the TV and to the other person through his/her headphones and have the capacity to selectively adjust the volume of the multiple inputs to the desired levels. In the case of two hard of hearing persons watching TV together, the present invention allows the TV input to be split—sending the sound signal from the TV to two different personal sound system units so that each hard of hearing person can control the volume of the sound inputs (from the other person and from the TV) as desired. Alternately, the present invention can be configured such that the TV input into one user's unit can be transmitted to another user's unit via the inter-unit connector.

The system also effectively addresses another problem that the hard of hearing person sometimes struggles with when talking to several people in a group. Because they cannot hear their own voice that well when talking to another person, even when wearing hearing aids, they can raise their voice and speak way too loudly for the situation at times. Because each user of the present invention speaks into a microphone, and because that voice input can be volume-adjusted along with each of the other inputs coming into the system, the hard of hearing user can adjust the volume of his/her voice so that it is at a comparable level to the volume of the voices of the other people with whom he/she is speaking. When watching TV and talking together, the users can continuously adjust the relative volumes of various inputs (such as the TV audio signal, the voice of the other hard of hearing person and his/her own voice) as frequently as desired.

Another problem the hard of hearing user experiences when listening to television while wearing headphones is that it is very difficult to hear any sounds coming from the immediate environment (because the headphones cover the ears, blocking out other sounds). Some of these sounds coming from the immediate environment may be important (such as an alarm, a knock at the door, a tea kettle whistling, a telephone ringing, or somebody calling from another room announcing that "dinner is ready"). The present invention addresses this particular problem by equipping the portable sound unit with an omnidirectional, long distance pick-up microphone input into the unit, so that the user can selectively adjust the volume of the outside audio input, while at the same time listening to television and to another person via his/her headphones connected to the unit.

i) Problems Hearing the Voices of Speakers Over the Background Track in TV Programs and Movies:

Even if the hard of hearing person is alone while listening to TV via headphones, there may be problems. The main problem is that when the hard of hearing person turns the volume up of the TV audio signal up, the volume of all of the sound tracks coming from the TV input (including music, sound effects and voices) are turned up at the same time. The hard of hearing person often has difficulty tuning into the voices of the speakers and filtering out the background noise or music coming from the TV input, even if the volume has been turned up to a high level. This can be a problem even for persons who have ordinary hearing.

One of the optional features of the present invention allows the operator of the unit to differentially adjust the volume of the voice or speaker track from the movie audio sound track from the background track. This allows the hard of hearing user the ability to turn the voice track of the movie up as high as desired so it can be heard more clearly against the background sound track, improving the listening experience dramatically.

j) Problems when Watching a Movie in the Theater with Friends:

Like watching television while talking with others, going to the movie theater with friends can pose similar problems for the hard of hearing person. The system of the present invention allows the hard of hearing person to go to a movie theater and plug the sound from the movie directly into one receptor in his/her portable unit while plugging the sound input from a friend's microphone into another, thereby allowing him/her to turn the volume up of the movie sound track or the friend's voice as high as desired without disturbing other people in the theater. A specific type of the system for use in movie theaters provides stationary units at each seat where the hard of hearing person can input the sound track from the movie directly into his/her portable unit. In this way, the hard of hearing user of the system can differentially adjust the volume of the sound track from the movie relative to other inputs into the system, as desired. Additionally, the fixed units can provide the ability for the user to differentially adjust the volume of the voice track from the movie from the background music or noise track, improving the hard of hearing user's ability to hear what is being said.

k) Problems while Communicating with Professionals in their Offices:

Hard of hearing persons can have difficulty communicating with professionals, especially when they also want to include a family member in a discussion with the professional. For example, a hard of hearing person may bring their spouse with them to talk to an attorney or doctor, but have great difficulty tuning into the different speakers during the discussion, even if they wear conventional hearing aids. What sometimes happens is that the professional begins speaking only to the "helper" and not to the hard of hearing person, because the professional is not sure that the hard of hearing person is really "getting" everything that is being said. The hearing-assistive system of the present invention provides a way for the hard of hearing person to participate in these types of discussions without being handicapped by his relative hearing difficulties. He/she can plug in an input from each speaker's microphone into his/her unit and then adjust the volumes as high as desired so that he/she can hear as well as possible while not requiring the other people to speak in very high volumes in order to be heard. By using the present system, all persons involved in the discussion can speak in a comfortable voice volume, and the "helper" can ask the hard of hearing user questions related to whether he/she is "getting" everything that is being said or whether he/she needs some more explanation.

l) Problems while Talking with a Professional and a Helper Over the Phone:

It is especially difficult for people who are hard of hearing to communicate over the telephone. Often the hard of hearing person has a relative or family member who tries to be available during important phone calls so that he/she can help the hard of hearing person understand what is being said. But the person who is not hard of hearing usually cannot hear what is being said on the phone and must have everything repeated. The system of the present invention provides a means to plug the two-way (or three-way) telephone audio signals into the units of both the hard of hearing person and the relative or friend who is helping him/her, so that a discussion can occur between all three persons and any miscommunications can be clarified while the discussion is occurring. In addition, the system optionally can filter out background noise from an incoming telephone call, making it easier for the hard of hearing person (or even the person of ordinary hearing) to decipher what the caller is saying.

m) Problems when an Interpreter is Needed:

This system can be especially helpful if the hard of hearing person involved in the conversation with the professional over the phone speaks a different language than the professional and an interpreter is needed. For example, if the hard of hearing person is non-English speaking and needs an interpreter when talking to the professional in person, then he/she could have each of the other people in the discussion (including the English-speaking professional and the interpreter) plug into his/her portable sound unit, and then selectively adjust the volume of the different speakers so as to optimize their communication experience. In this way, the interpreter does not have to worry about providing translation at a very high volume, which could be a strain for both the professional and the interpreter. Additionally, if the hard of hearing person is communicating with the professional and interpreter over the telephone, he/she can input the telephone audio signal into his/her unit and adjust the volume as desired. Some units are also equipped with a telephone separator element which can separate out the signals from the voices coming into the unit, allowing the user to differentially adjust the volume of the different voices coming into the unit from the telephone as desired.

Section II. Review of Prior Art and its Ineffectiveness in Addressing Problems Facing Persons Who are Hard of Hearing:

Improvements in conventional hearing aids have tried to address the problems that people who are hard of hearing face in many public and private settings, but these improvements have only been minimally effective. Some hearing aids allow the user to adjust the hearing aid to different receiver settings (e.g. near-far). There are hearing aids that use filtering technology to filter out background noises. There are also hearing aids having special settings for telephone use. More recently, hearing aids have been developed to allow the inputs to be shared between hearing aid users. There are hearing aids that allow the direct input of a specific sound source (such as from a CD player) into the hearing aid. There are hearing aids that are contained in headsets that allow the input from a sound source to be shared. Other hearing assistive communication systems, including bug-in-the ear with microphone headsets, create a shared circuit of inputs and outputs. Also networked computer, telephone and walkie-talkies systems allow users to share inputs. All of these potentially hearing-assistive systems are useful in specific situations, but none of them address the problems that hard of hearing persons face in settings as discussed in the previous section of this application.

Existing music and digital mastery sound systems allow for multiple inputs (or tracks from an audio source) to be inputted, sending them through a mixer which can control the volumes of the inputs and other features. But these systems do not provide a way for a specific hard of hearing person to share all of the inputs into the system with others, while differentially controlling the volume of the music input at the same time he/she is controlling the volume of a speaker's input with whom he/she is communicating, thereby creating his/her own personally volume-adjusted set of audio signals, while another hard of hearing person creates a different set of personally volume-adjusted audio signals coming from the same inputs into the connected units. Also, a tape recorder allows the user to input different audio signals, controlling the volume of each as desired. However, sound recorders have nothing that allows the user to selectively control the volume of the different inputs into a set of personally adjusted audio signals that are separate from another user sharing the sound inputs who differentially controls the volume of inputs coming into the connected units creating his/her own set of volume-adjusted signals.

There are a number of inventions having to do with a single component of the system of the present invention. They address special types of headsets (U.S. Pat. No. 5,111,461); types of mixers (U.S. Pat. No. 5,487,067); systems to adjust input signals from telephones (U.S. Pat. No. 6,212,496) and computer telephony systems (U.S. Pat. No. 6,748,095); systems providing filters to hearing aids to make it easier to distinguish speech from other background noise (U.S. Pat. No. 6,651,040; U.S. Pat. No. 6,381,308; U.S. Pat. No. 6,778,674; and WO 2001/0189263); and personal listening systems of Wood and Saliterman, all of which were cited in an earlier section of this application. None of these patented systems of the prior art provide effective solutions for the problems described in the previous section that hard of hearing persons must face in diverse public and private settings.

Taking the situation of dining in a noisy restaurant, the person using hearing aids in the middle of the table and talking to two persons on his/her left while two other persons are having a different conversation on his/her right would have a very difficult time "tuning in" to the conversation, because even if he/she changed the setting to "near" on his/her hearing aid, there are several people who are in "near" proximity whose voices would also get picked up by the hearing aid, making it impossible to clearly separate the two conversations. So this type of hearing assistive device does not work when the hard of hearing person is in a group setting like the noisy restaurant. Neither can the hard of hearing person tune in to a song being played on another diner's IPOD while sharing his/her reactions to the music with the other diner because the diner and the IPOD are in the same proximity as well. If the two were to turn the volume up on the IPOD so as to hear it over all the other nearby conversations and noise, then this could be disruptive to other diners. Also, there is a limit to how many different settings could be positioned on a hearing aid and whether you could have a "blend" of all of the selected inputs at the chosen volume levels, and whether it would be possible to change the settings continuously during the course of an interaction with the existing hearing-assistive devices of the prior art.

Clearly, none of the prior art can address the problems facing the hard of hearing user in this setting like the present invention. The portable hearing-assistive sound unit system allows hard of hearing persons (and persons of ordinary hearing dining together) to share the inputs of each person's voice, while blocking out background noise (or the voices of other people not involved in the conversation). Each voice input can be volume-adjusted (in relation to other inputs) by each unit operator, which gives each operator the ability to sub-group into a conversation with fewer people involved while others in the group have a separate conversation. The hard of hearing person can turn the volume up as high as desired without disturbing anyone else. The music from an IPOD can be plugged in to the system and each operator can adjust the volume of that input while continuing to talk with others as he/she chooses, while the other people in the group can make different choices about whether or not to "tune in" to the music. Another advantage of the present invention is that it can allow a hard of hearing operator the ability to answer an incoming call without having to leave the table or disconnect from the ongoing interaction, which is highly desirable. It can be very disruptive for a diner to take a call at the dinner table, so this feature can be very helpful to the person who takes the call (as well as everybody else).

Focusing in on the setting where a hard of hearing person is listening to TV and talking to others at the same time, it is clear that the current invention provides solutions to many problems in this setting. There are hearing aids which can be directly connected to inputs from televisions or stereos. But this type of connection would not allow the hard of hearing person to talk with another person in the room while listening to the TV directly inputted into his/her hearing aids. It is conceivable that hearing aids could be capable of separating out the voice and background sound tracks from the audio input from the television. But hearing aids do not generally have controls that allow the user to continuously adjust the relative volume of one track in relation to another. And hearing aids of the prior art could not allow the input of another speaker's voice to be directly inputted into the hearing aid, along with the direct input from the television, and therefore would not be effective in allowing the user to switch back and forth between turning up the soundtrack from the TV versus turning up the sound track of the other speaker. In addition, hard of hearing persons often gather in groups in which a lot of sub-conversations occur. Specifically, the hard of hearing person may be talking to someone right in front of him/her, but not talking to the person who is standing right next to that person. Hearing aids can be adjusted to target a sound source that is near or far from the user. But they cannot be adjusted to target a specific voice separated from other voices in the immediate proximity. However, the system of the present invention allows the hard of hearing person to input all of the voices into the unit (or connected units) and then to differentially adjust the volume of each input, regardless of the proximity of the other persons to each other and to the hard of hearing user.

Now focusing in on the settings where the hard of hearing person wants to listen and work with another technological or communication device (such as telephones, computers, and IPOD's) while talking with other people at the same time, the prior art includes hearing aids that can receive a wireless or wire-line audio input signal from another device (such as from a telephone or stereo) directly into the hearing aid, thereby improving the clarity of that input. There are also hearing aids that can transmit the signal from one person's headphone receiver to another person's headphones, thereby making it possible to "share" an audio input signal on a very rudimentary basis. Finally, there is a type of hearing aid disclosed in U.S. Patent Application No. 2006/0067550, that shows hearing aids that can transmit an audio signal from a sound source to another person's hearing aids, and to another, until the signal is transmitted back to the original hearing aids, thereby improving the clarity of the signal. While these attempts of the prior art to allow persons who wear hearing aids to share sound inputs, they do not allow the comprehensive sharing of multiple inputs that the present invention allows to users who are hard of hearing and those who have ordinary hearing. In fact, this ability to share a signal audio signal would not address the problems described in this patent application involving hard of hearing persons in groups (where it is important to be able to separate audio inputs from voices of people who are in close proximity). Neither would these hearing aids address the problem of the hard of hearing user in a setting where he/she wants to use another technological or communications device while talking to other people at the same time.

Section III. Usefulness and Uniqueness of the Present Invention for Addressing Problems Facing Hard of Hearing Persons:

The previous sections of this application have shown that none of the reviewed prior art has the capacity to address the problems facing hard of hearing persons in the diverse settings described herein. The present invention is a highly useful and unique system capable of allowing a number of hard of hearing persons (and persons of ordinary hearing) to share multiple inputs at the same time, including inputs from the voices of several people near and far in proximity to the operator, to differentially adjust the volume of each input as desired by each operator, and to continuously select which specific inputs he/she wants to listen to or block out in real-time over the course of the interaction. In addition, the system makes it possible for the hard of hearing person to utilize other modern technological devices in more effective ways. For example, he/she can be "plugged in" to a discussion using the system, but decide to take a phone call at some point, putting the discussion on "hold" for a moment. He/she can talk to a friend or helper during a POWERPOINT lecture and discuss what is happening at the same time, thereby enhancing understanding. He/she can also record a lecture (with the adjustments made in volume of inputs while the lecture was recorded) and play it back at a later time to improve comprehension even more. The system can be co-located, connected or embedded in other technological devices which helps give hard of hearing persons access to our modern technological information-processing culture in diverse settings. The system can be used to talk to friends while at the same time listening to music from an IPOD together. The system can be used to assist the hard of hearing worker who must be able to respond to different types of communication technology, including face to face, intercom and telephone systems. The present invention can greatly enhance the communication experienced for persons who are hard of hearing when interacting with groups of other people, whether in a noisy restaurant or participating in a teleconferencing call at the office. Because the system is available in different configurations (such as tabletop, connected portable units, fixed input units, stationary systems, units having screens, keyboards and microprocessors, and units embedded, co-located or connected to other devices), they can address the needs of hard of hearing persons in diverse public and private settings. And finally, the inter-connectibility of the units with each other and with other technological devices makes it possible to create a universal system to improve the communication experience of hard of hearing persons and persons of ordinary hearing in all areas of life.

In addition to these advantages of the system over the prior art, the present invention is very convenient. One configuration of the unit is portable and can be worn attached to a belt around the waist or carried in a backpack. Another configuration can be placed in the center of a table to facilitate a discussion by multiple participants. Some configurations are likely to be much less expensive than conventional hearing aids of the prior art, since the kind of batteries needed for the present invention would be much cheaper (and easier to use) than current hearing aid batteries. In addition, the system of the present invention can be plugged in to an electrical outlet, not requiring the purchase of batteries at all. Finally, the hearing-assistive technology of the present invention could be directly inputted into the hard of hearing person's hearing aid, thus making it possible to reap the benefits of the present invention and the benefits of the hearing aids at the same time.

The personal portable hearing-assistive sound unit system of the present invention enables hard of hearing persons to continue to interact with the hearing world for work or pleasure. This, in turn, leads to improved productivity and quality of life for persons who are hard of hearing and for persons with ordinary hearing. Particularly in "hard to hear" settings, the system of the present invention has universal appeal.

IV. Description of an Innovative Method for Making the Hearing-Assistive Technology of the Present Invention Available in Diverse Public and Private Settings The method presented in this patent application (for a universal system for improving the communication experience of hard of hearing persons) is highly effective, convenient, user-friendly and innovative. No other method exists in the prior art which addresses the problems faced by hard of hearing persons in diverse settings as described in the present application.

It has been shown that the prior art with respect to hearing aids does not provide any examples of devices that could be inter-connected to address the needs of hard of hearing persons in diverse settings.

There are internet chat rooms and network servers where people can see and talk to each other in groups, but these systems do not have controls for each participant to differentially adjust the volume of each input, as does the present invention. There are "bug in the ear" headset communication systems that "share" inputs, but these systems cannot separate out each audio input for the user so he/she can differentially control the volume of each one as desired, and there is no separate input for each voice going into the system so the user cannot differentially adjust the volume (or block the audio signal completely) as is possible with the present invention. Finally, a standard sound mixer has a way to differentially adjust the volume of multiple inputs coming into the device, but there is only one set of controls, so different users of the mixer cannot differentially adjust the volume of the audio inputs, as desired.

The method claimed in this application for creating a universal system for improving the communication experience of persons who are who are hard of hearing (or persons of ordinary hearing in hard to hear settings) does not exist in the prior art. Individuals can have hearing aids fitted for their hearing deficits. They can use headsets with other devices and turn up the volume on these devices to improve their hearing. They can get ear-pieces receiving transmissions from an amplifier and turn up the volume on the sound input without distracting others (as in Listen Up product). But none of the methods extrapolated from any of these systems or devices can address the problems hard of hearing persons face as outlined in the background section of this application.

We have disclosed how the system of the present invention can be standardized and distributed across a wide range of public and private settings, enabling a large number of hard of hearing persons to improve their communication experience. The inter-connectible units of the present invention can be hard-wired throughout public buildings and residences. They can be connected to internets and/or intranets to facilitate transfer through computerized networks. They can operate on hard-wired or wireless signals. They can be used in conjunction with other communications technological equipment, including computers and telephones and BLACKBERRIES. Furthermore, the portable units can be interconnected and integrated with other hard-wired stationary systems to address additional problems confronting hard of hearing persons. Stationary units with fixed inputs can be made available for persons in movie theaters, stadiums and lecture halls. Other units can make it possible for the hard of hearing user to continue working in stores and ticket counters and offices.

This unique method of providing a system to enable hard of hearing people to continue to interact with the hearing world for work or pleasure is highly useful, potentially improving productivity and the quality of life for thousands of people. People who are not hard of hearing can also find this system to be very useful. Specifically, they can improve their communication with hard of hearing persons, but also improve their own listening experience in loud, hard to hear places. Finally, this method of providing the hearing-assistive sound unit technology of the present invention allows our society another opportunity to be inclusive of people who have disabilities associated with hearing loss and impairments. Inclusiveness is a highly valued goal in our present society. Our laws (particularly the ADA) require that businesses make reasonable accommodations to persons with disabilities, including hard of hearing persons. The present invention and method for standardizing and disseminating this new technology could provide the means to make this possible.

The clear and identifiable steps to the method of providing a universal system to enhance communication for persons who are hard of hearing are as follows: First, provide devices that can be inter-connectible so that multiple inputs can be shared by hard of hearing and ordinary hearing users, with each device having a set of controls which allow each operator the ability to differentially adjust the volume of each input into the inter-connected devices continuously as desired, thus allowing each operator to hear the sound of the combined inputs he/she is selecting and volume-adjusting over the course of the interaction. Second, it will be important to standardize the inter-connectible devices so that they can be used in combination with other technological devices, such as televisions, computers, IPODs, PDA's, laptops, cell phones, etc. And thirdly, it is important that the hearing-assistive devices be disseminated with the necessary features and configurations to meet the needs of hard of hearing persons in diverse public and private settings as described in this patent application.

SUMMARY OF THE INVENTION

The present invention is a hearing-assistive communications system that allows hard of hearing persons to address problems that they face in a number of social settings (such as when dining out with friends in a noisy restaurant). Unlike conventional hearing aids that are worn in or near the ear, the hearing-assistive devices of the present invention, the units, are generally positioned within an arm's reach away from the users, from where they transmit audio signals to each user's headphones.

The hearing-assistive sound units are capable of transmitting multiple audio input signals at the same time which can be shared by all persons using any of the connected units. The inputs can include the voices of several other persons interacting with the hard of hearing user, as well as wired or wireless audio inputs from televisions, stereos, radios, telephones or computers. Ideally, when using the system, each person who is participating in the ongoing interaction speaks into a microphone contained in a headset (with the headset consisting of a microphone combined with headphones). The hard of hearing person operating the controls of any of the connected units has the capacity to separately and easily adjust the volume of each audio signal coming into any of the connected units as frequently as desired, over the duration of the interaction. This capacity leads to an improved communication experience for the hard of hearing user because he/she can turn up the volume of a selected input (such as the voice of another user with whom he/she is conversing) while turning down or blocking out the volume of another audio input (such as from background music or the voices of others not involved in the conversation). In this manner, the hard of hearing user can then hear the voice of the other person with whom he/she is speaking more clearly without the other person having to raise his/her voice to uncomfortable levels in order to be heard. Additionally, the system enables the users of the connected sound units to share multiple inputs as a whole group, or, if desired, the system also enables them to "tune in" to the voices of a subgroup of those who are involved in the interaction and "tune out" or block the voices of others, so that the hard of hearing user can engage in a separate, even "private," conversation while other users sitting nearby are having a different conversation. When desired, the hard of hearing user can switch back to communicating with the whole group.

In addition to those described above, the present invention provides many other advantages and solutions to the communication problems faced by hard of hearing persons in both public and private settings. These useful applications of the system in diverse settings cannot be accomplished by any hearing-assistive devices of the prior art. A brief summary of each of the nine preferred embodiments of the invention, along with a discussion of the specific capabilities that make each embodiment unique and superior to any hearing-assistive devices of the prior art, are described below. Additional features that may be added to any one of the embodiments to enhance its usefulness in specific settings are also described. It should be noted that these additional features, along with the nine preferred embodiments, can be combined in different ways to meet even more of the specific needs of the hard of hearing person in a variety of settings.

The first preferred embodiment of the present invention consists of inter-connectible, portable devices or "units"; with each unit being capable of transmitting multiple audio signals at the same time which can be shared by all persons using any of the connected units; and, with the person operating the controls of any of the connected units having the capacity to separately and easily adjust the volume of each audio signal coming into any of the connected units as frequently as desired, over the duration of the interaction. The person operating one of the connected units in a group can turn up the volume of a single person's voice and turn down the volume of the other voices, making it possible to engage in a "private" conversation while sitting in the middle of a group. While there are hearing aids of the prior art equipped to allow the hard of hearing user to adjust the range of the sound input (e.g. to focus in on the voice of a person he is talking to, or to focus on a sound source that is farther away, such as a live concert), these devices do not address the situation in which the hard of hearing person is talking with a number of people in a group and then wants to have a separate conversation with a subgroup of those people.

The second preferred embodiment involves a hard of hearing person using the system to watch television while talking with friends at the same time. This embodiment of the invention is particularly useful in situations where the hard of hearing person wants to talk with a friend while listening to music or watching television together. This unit is equipped with the optional unit output speaker, which makes it possible for persons who are not connected to the unit to still be able to hear the sound inputs going through the unit. This unit is also equipped with an omnidirectional microphone which can become one of the audio inputs into the unit, making it possible for the hard of hearing user wearing headphones to still be aware of sounds from the environment (such as a tea kettle whistling or a phone ringing). This portable hearing-assistive sound unit can have the capability to separate out the soundtracks from a single source of audio input (such as the speaking tracks from the background tracks in a movie soundtrack). This feature provides the hard of hearing user with the capability to turn the volume of the speaking parts from a television or DVD movie way up so they can be heard more clearly in relation to the background noise and music. While there are hearing aids of the prior art that can filter out background noise, these devices are not effective in the situation in which the hard of hearing user wants to watch a movie with a friend, sometimes talking about what is going on, and sometimes not, sometimes wanting to be aware of sounds from the environment, and usually wanting to turn the volume of the speaking track way up without disturbing others. However, the portable units of the present invention can accomplish all of these objectives.

The third preferred embodiment involves units that can be used in conjunction with telephony systems, allowing for more effective use of telephones and cell phones, especially for the hard of hearing user. This embodiment is particularly effective in addressing problems that the hard of hearing user experiences when talking over the phone with a professional, but having a friend in the room who is trying to assist with the phone call. While there are hearing aids of the prior art which are designed to help the hard of hearing user when communicating over the telephone, they are only minimally effective, whereas the units of the present invention are perfectly capable of addressing these problems in a comprehensive way.

In the fourth preferred embodiment of the invention, the portable units are equipped with a screen, keyboard and computer microprocessors hosting software that can send visual information through a mini-screen attachment to the units, enabling the user to view visual information while talking together with others. In this way, persons using the system could send photos to the mini-screen of all participants so that they could discuss this material while talking together using the system. This feature could also allow users to view, read and discuss written documents, thereby enhancing the hard of hearing user's interaction experience. This configuration can also allow users to have shared internet access and to view email and online slide presentations while discussing the material together. When the units are equipped with a keyboard and screen, the users can engage in both oral and written communication. Word processing and document sharing software and "instant messaging" programs can be utilized while users are talking together and selectively controlling the various sound inputs as desired at the same time. This system can optionally be equipped with the capability to record all inputs (visual and audio) so that they can be played back at a later time by the hard of hearing user, thereby increasing his/her opportunities to review what had transpired and improve comprehension.

In the fifth preferred embodiment, a unit with multiple input capacities is equipped with enhanced telephony capabilities so it can be used in business settings for teleconferencing calls, as well as virtual and real-life meetings involving both persons who are hard of hearing and persons having ordinary hearing. This system could be built-in to the table and remain stationary so that the facilities would be ready whenever they were needed. This embodiment generally uses a table top unit having many possible input receptors for the voices of participants, whether they be voices from incoming phone calls, internet connections or directional microphones from headsets of persons physically present in the room. Each incoming input is routed separately through the amplifier inside the unit (which is connected to each operator's controls), making it possible for the hard of hearing operator to turn the volume up on the voice of the speaker as loud as desired without having to disturb other people who are participating in the teleconference. The hard of hearing user can also engage in a private conversation with one or more users at the teleconference by turning down or blocking all the other users while engaging in this subgroup.

In addition to the volume controls on the control panel of each unit, set buttons can optionally be provided to allow the user to set the level of volume to be maintained for each input; "block" buttons can be provided so that he/she can have a private conversation during an ongoing teleconference; and indicator lights can optionally be provided to give the user information about which inputs are "on" in the overall system, which inputs are in a subgroup conversation with the user, and which persons have asked or been asked to interrupt the user or join in the sub-conversation.

The sixth preferred embodiment involves a unit that can be used while working in a noisy environment requiring that the user engage in different types of communication (such as a face-to-face conversation with a customer, answering a cell phone call from another, and attending to an intercom message) all at the same time. In this embodiment, the units often have fixed locations and/or audio inputs that are specifically selected for the job at hand.

The seventh preferred embodiment involves units that are fixed in certain, usually public settings with pre-determined sources of audio input (such as those already positioned for use in theaters, lecture halls or stadiums). When used in a movie theater setting, the fixed unit allows the hard of hearing user to plug in to the unit, along with a friend, and then differentially adjust the volume of the movie soundtrack and the volume of his/her friend's voice throughout the movie, as desired. This unit can be equipped with a sound-track separator component, which allows the user to differentially adjust the relative volume of the speaker track in relation to the background track of the movie.

The eighth preferred embodiment involves units that can be used in vehicles to enhance communication while driving, riding or parking. In this embodiment of the invention, the unit can be integrated with other operating systems, including the GPS, cell phone and radio within the vehicle. The unit can also be equipped with an omnidirectional microphone, which makes it possible for the driver to hear sounds from the environment (such as sirens) even when he/she is wearing a headset while using the system.

The ninth preferred embodiment involves units that can be co-located, embedded or connected in synchronous operation with other devices.

The present patent application also claims a unique method for providing a universal, hearing-assistive system of interconnecting devices, (similar in function but not necessarily identical in design to the portable hearing-assistive sound units of the present invention), for the purpose of improving the listening and communication experience of persons who are hard of hearing in diverse public and private settings.

OBJECTS OF THE INVENTION

Accordingly, it is a first object of the invention to improve communication for hard of hearing persons in noisy environments, to enable hard of hearing persons to communicate more clearly with professionals when meeting in their offices in person, and to talk with other people while listening to electronic devices.

It is a second object of the invention to make it easier for hard of hearing persons and persons with ordinary hearing to communicate in person when they are also watching television together at the same time.

It is a third object of the invention to make it easier for hard of hearing persons and persons with ordinary hearing to communicate by telephone.

It is a fourth object of the invention to make it easier for hard of hearing persons and persons with ordinary hearing to communicate while using computers or personal digital assistants.

It is a fifth object of the invention to make it easier for hard of hearing persons and persons with ordinary hearing to communicate in business settings, including teleconferencing sessions and business meetings.

It is a sixth object of the invention to improve the working experience of hard of hearing persons and persons with ordinary hearing by providing a hearing-assistive system for communicating in person, via intercom, and over the telephone at work.

It is the seventh object of the invention to improve the listening experience for hard of hearing persons when watching a movie with friends at the theater.

It is the eighth object of the invention to improve communication for hard of hearing persons and persons with ordinary hearing while traveling in vehicles.

It is the ninth object of the invention to improve adaptability of hard of hearing persons to settings where they must use modern technology in order to participate effectively, by providing a hearing-assistive system that can be co-located, embedded or connected to other technological devices including DVRs, cell phones, IPODs, laptops, PDA's, radios, computers, etc.

It is the tenth object of the invention to provide a universal method for hard of hearing persons and persons with ordinary hearing to improve the quality of their communication and listening experience in diverse public and private settings for work and leisure.

Furthermore, it is an object of the invention to provide improved elements and arrangements thereof in an apparatus for the purposes described which is inexpensive, dependable, convenient and fully effective in accomplishing its intended purposes.

These and other objects of the present invention will become readily apparent upon further review of the following specification and drawings.

Figure 1:
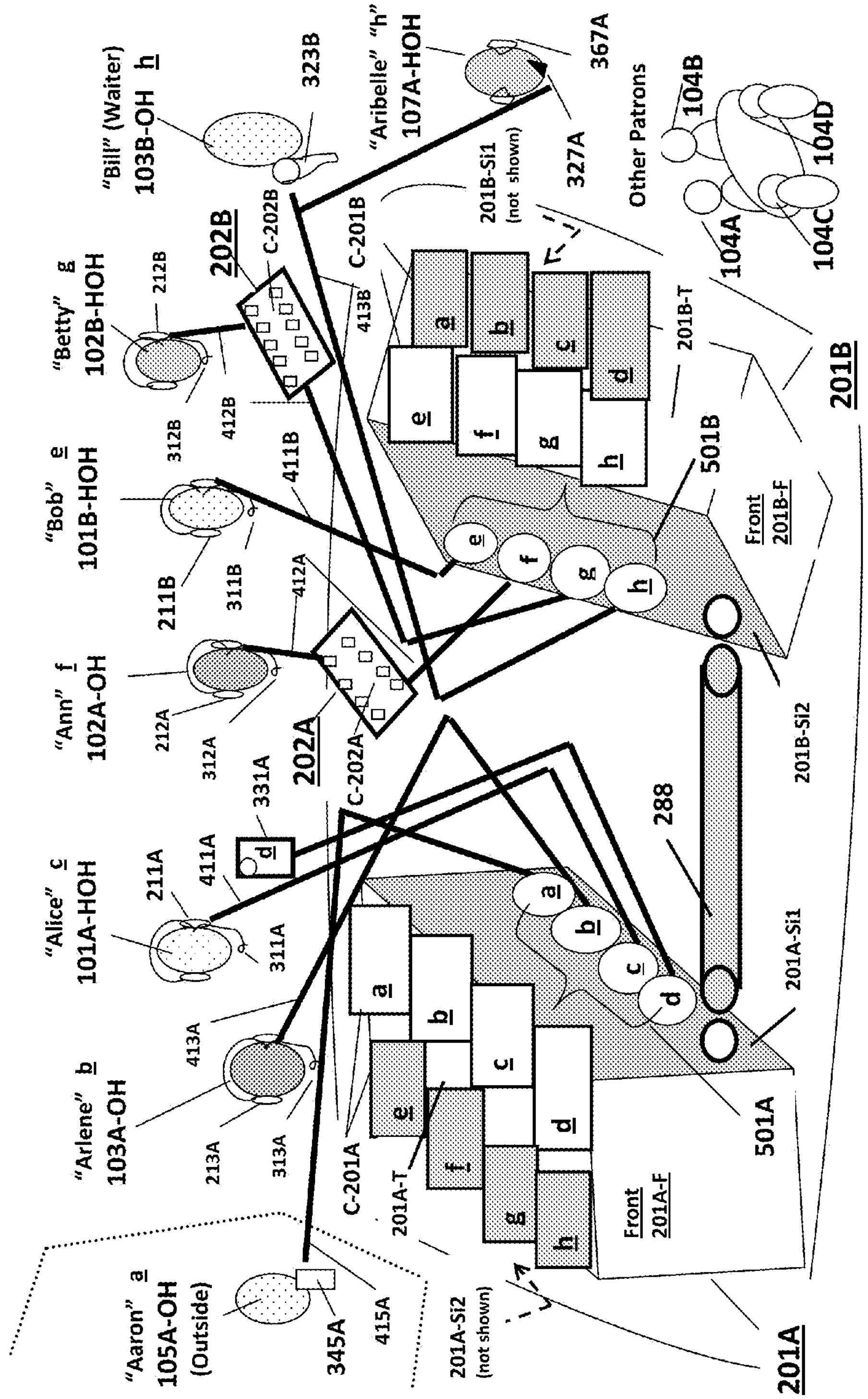
FIG. 1 is a schematic view of the first preferred embodiment of the invention in a setting in which a number of hard of hearing users, and users with ordinary hearing, are operating complete units and controls only units while dining in a noisy restaurant.

Figures are not drawn to scale. Specifically the size of persons shown operating the system are much smaller than the units being described. The units, features, control panels and electrical circuitry are enlarged so as to show greater detail.

Similar reference characters denote corresponding features consistently throughout the attached drawings.

DETAILED DESCRIPTION OF THE PREFERRED EMBODIMENTS

I. Overview of Portable Hearing—Assistive Sound Unit System

The present invention provides a system for improving communication for hard of hearing persons or persons of ordinary hearing in hard to hear settings. The Background Section of this application outlined problems that the hard of hearing person faces when communicating in many situations including small group get-togethers, while watching television and conversing with others, while communicating with professionals, while talking on the phone, while traveling in the car, while watching a movie in a theater, while attending a lecture or visiting a sports arena with a friend, and while working in diverse settings.

The Background Section also demonstrated how the prior art does not provide adequate solutions for these problems. The main drawback of technology of the prior art (which includes conventional hearing aids) is that it does not allow the hard of hearing user to share multiple audio inputs with others while he/she is continuously and easily adjusting the volume of each input relative to the others as desired in real-time throughout the interaction. While there are some hearing assistive devices of the prior art that have attempted to address some of the problems that the hard of hearing person faces in many social and work settings, these attempts have been met with only minimal success. A review of the prior art provided in the Background Section of this application made it clear that the system of the present invention is needed to address these problems effectively. The present invention does this by providing a system of interconnectible and "networkable" hearing-assistive sound units that can dramatically improve the listening and communication experience of persons who are hard of hearing as well as persons of ordinary hearing in "hard to hear" settings.

The present invention is described in this patent application as having nine preferred embodiments that can be re-configured in various ways, in conjunction with additional optional features, to target specific problems facing persons who are hard of hearing in a variety of public and private settings. The advantages of each of these embodiments and additional features over the prior art will be pointed out in later sections of this application where each of the preferred embodiments is described in detail.

The Invention's Preferred Embodiments

The nine preferred embodiments of the present invention are each illustrated by the figures indicated below.

Figure 2:
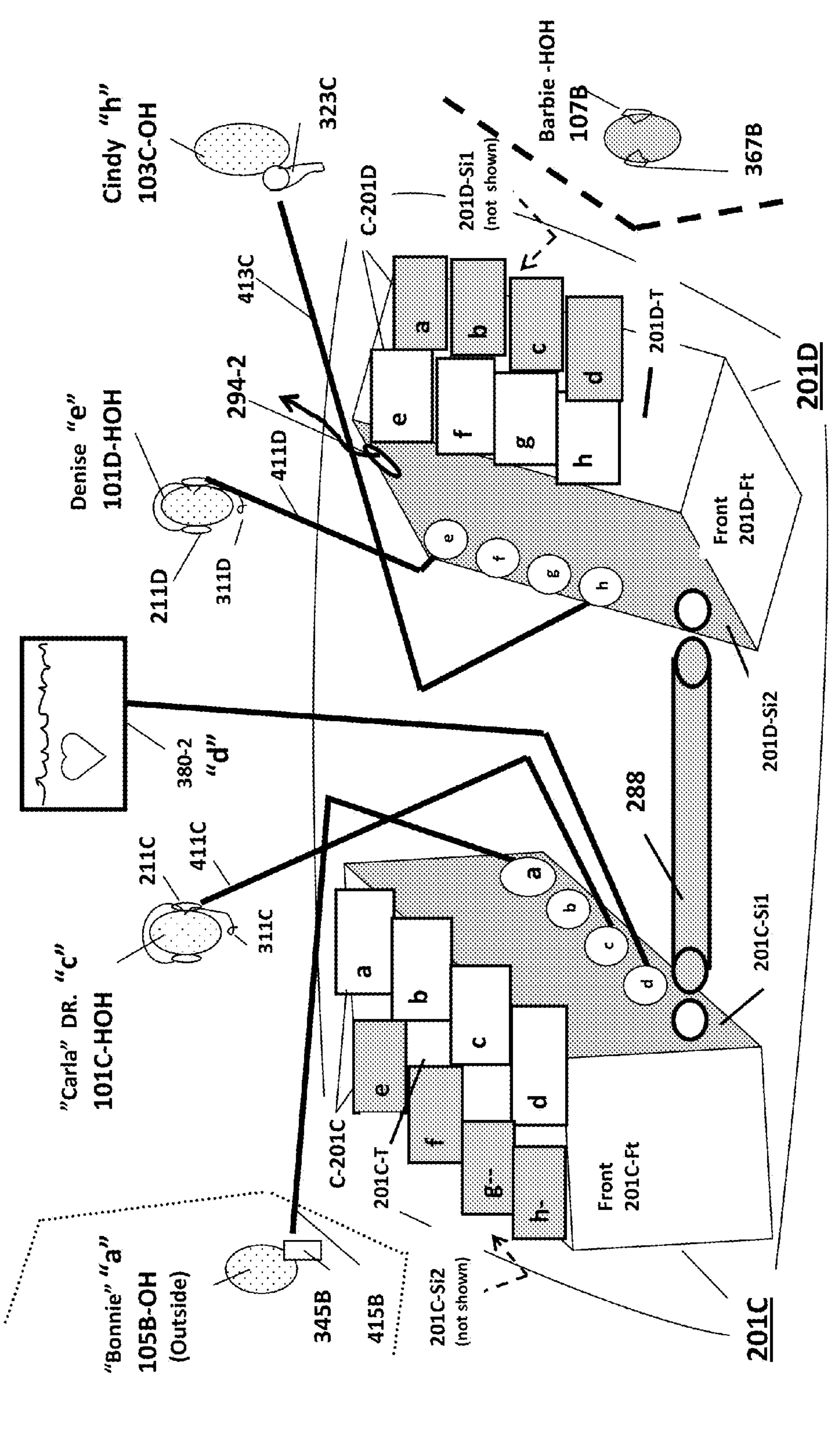
FIG. 2 is another schematic view of the first preferred embodiment of the invention, showing the operation of the system in a setting where the hard of hearing user is meeting with a helper and his doctor in the doctor's office.

The first preferred embodiment involves two or more connected units with two or more users operating a set of controls. This embodiment is shown being used in two different settings with additional optional features (FIGS. 1 and 2). In FIG. 1 a number of hard of hearing persons as well as persons having ordinary hearing are using the system while dining in a noisy restaurant. In FIG. 2 a hard of hearing patient and her helper are meeting in the doctor's office and reviewing a monitor playing the results of a cardiovascular test with audiovisual outputs while the patient, helper and doctor use the system to facilitate communication.

Figure 3:
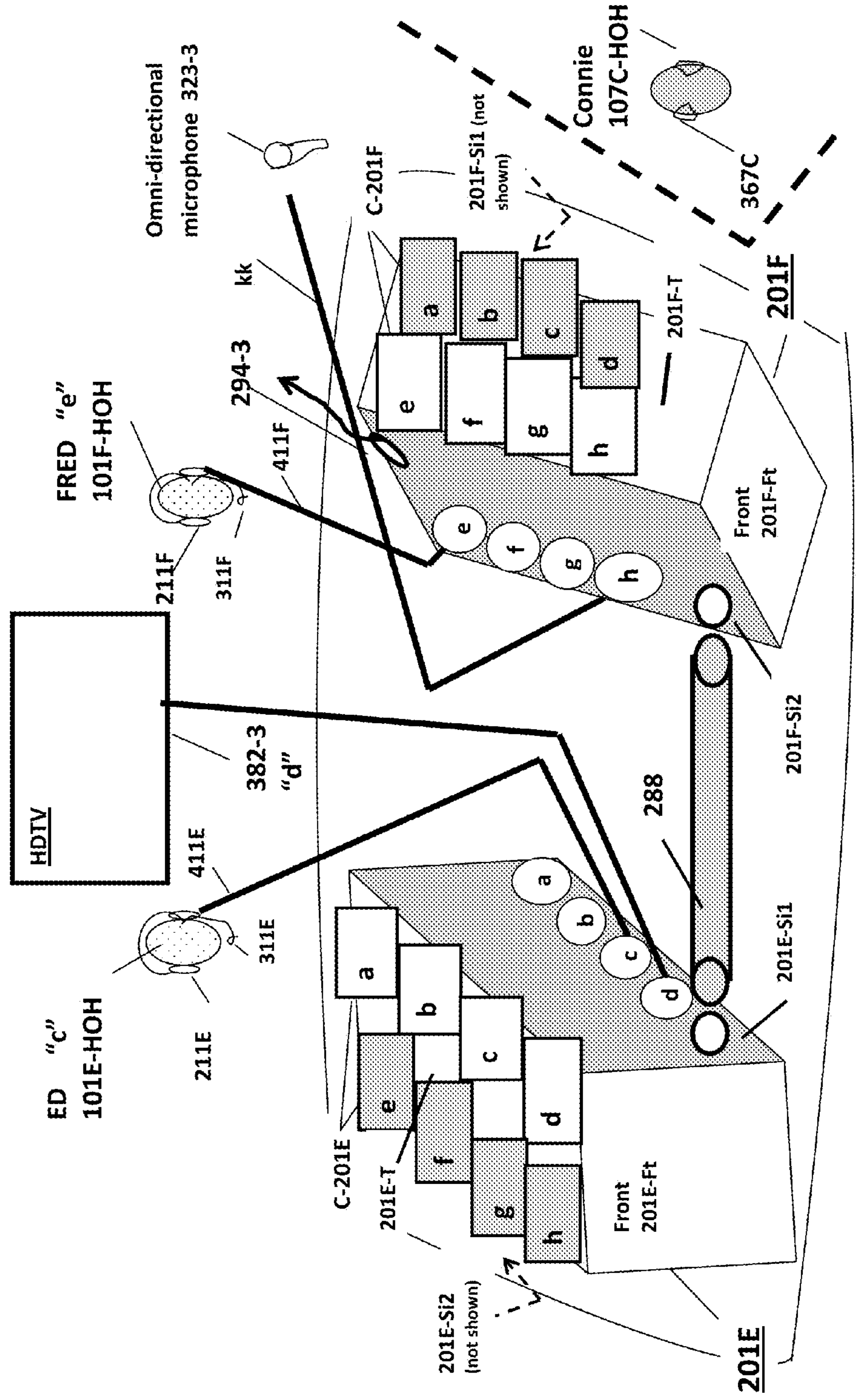
FIG. 3 is a schematic view of the second preferred embodiment of the invention, which shows a hard of hearing person using the system to watch television with some friends.
Figure 4:
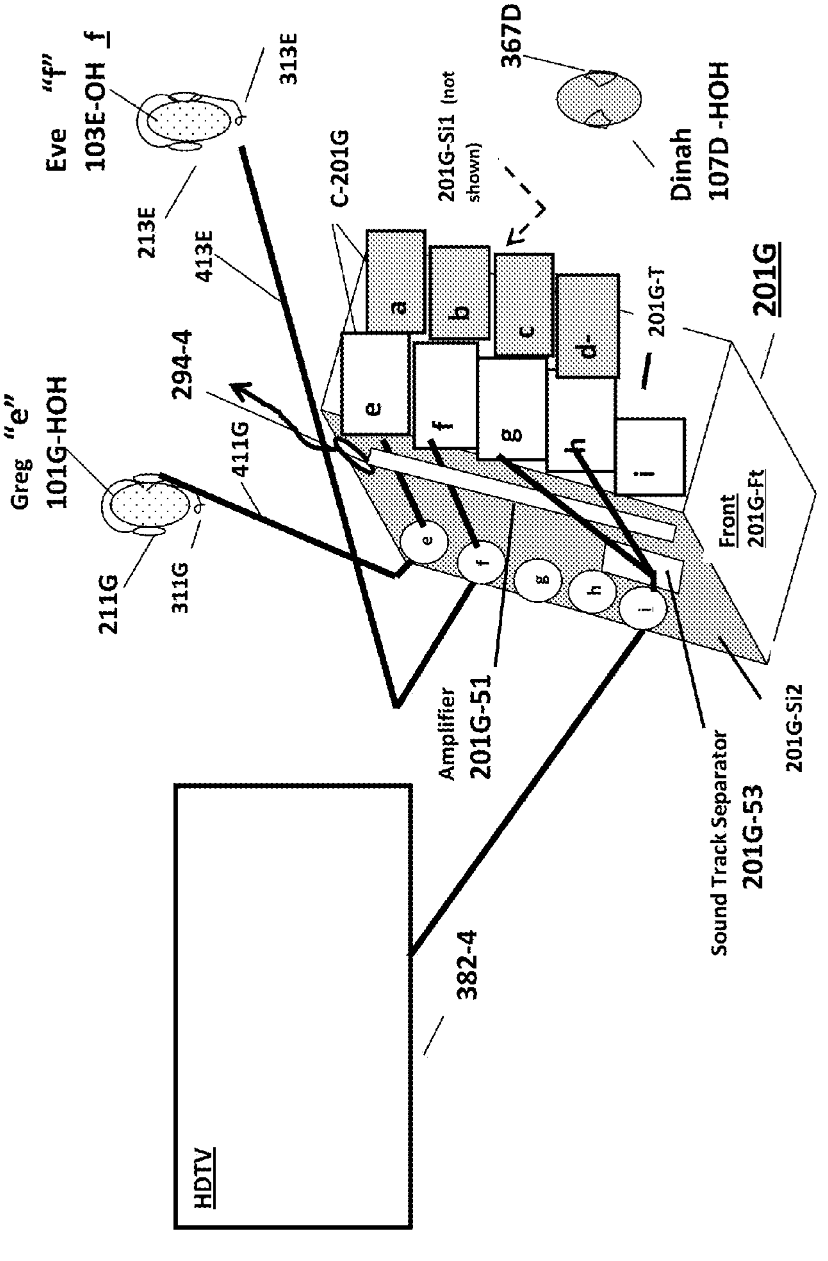
FIG. 4 is a schematic view of the second preferred embodiment of the invention, which shows a single unit with the optional feature of a sound-track separator being used by the operator who is watching television and talking with a friend at the same time.

The second preferred embodiment involves using the system while watching television (FIGS. 3 and 4). FIG. 3 shows several people watching TV together while using the system. In this embodiment, the unit is equipped with the optional unit output speaker, which makes it possible for persons who are not connected to the unit to still be able to hear the sound inputs going through the unit. In FIG. 4, one hard of hearing person is wearing a headset while using a single complete unit with the optional sound track separator component to watch television and listen while talking to a friend at the same time. The sound-track separator component gives the user the capacity to separate out tracks from a single source of audio input (e.g. the voice track from the background sound track from the television audio input) so that the volume of each track can be adjusted by the user as desired. This unit is also equipped with an omnidirectional microphone which becomes one of the audio inputs into the unit, making it possible for the hard of hearing user wearing headphones to still be aware of sounds from the environment (such as a tea kettle whistling or a phone ringing).

Figure 5:
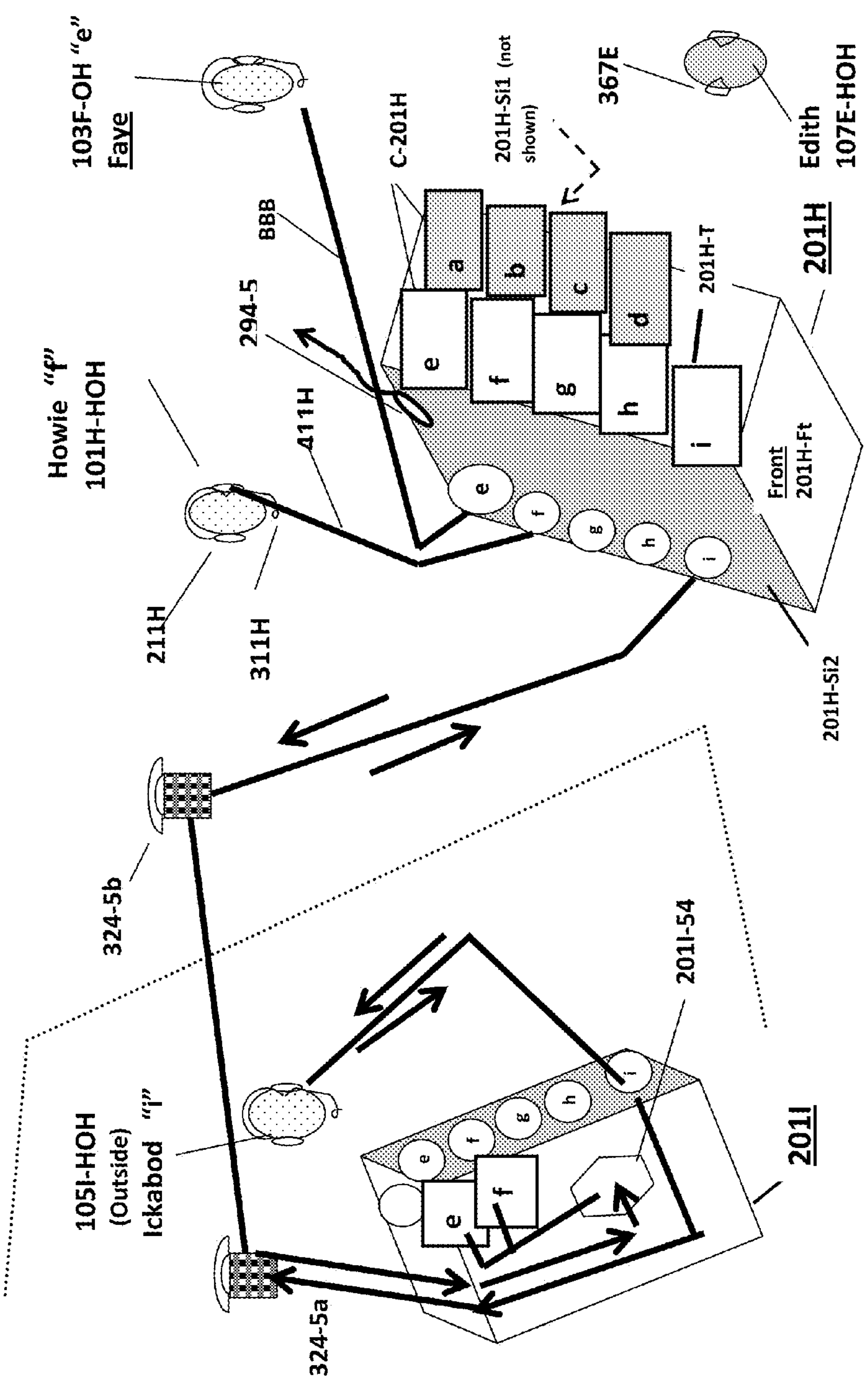
FIG. 5 is a schematic view of the third preferred embodiment of the invention, showing the operation of the unit in conjunction with phone operations in a situation where a hard of hearing person is using the system to talk to a friend who is in the room with him, and then taking a phone call at the same time.
Figure 6:
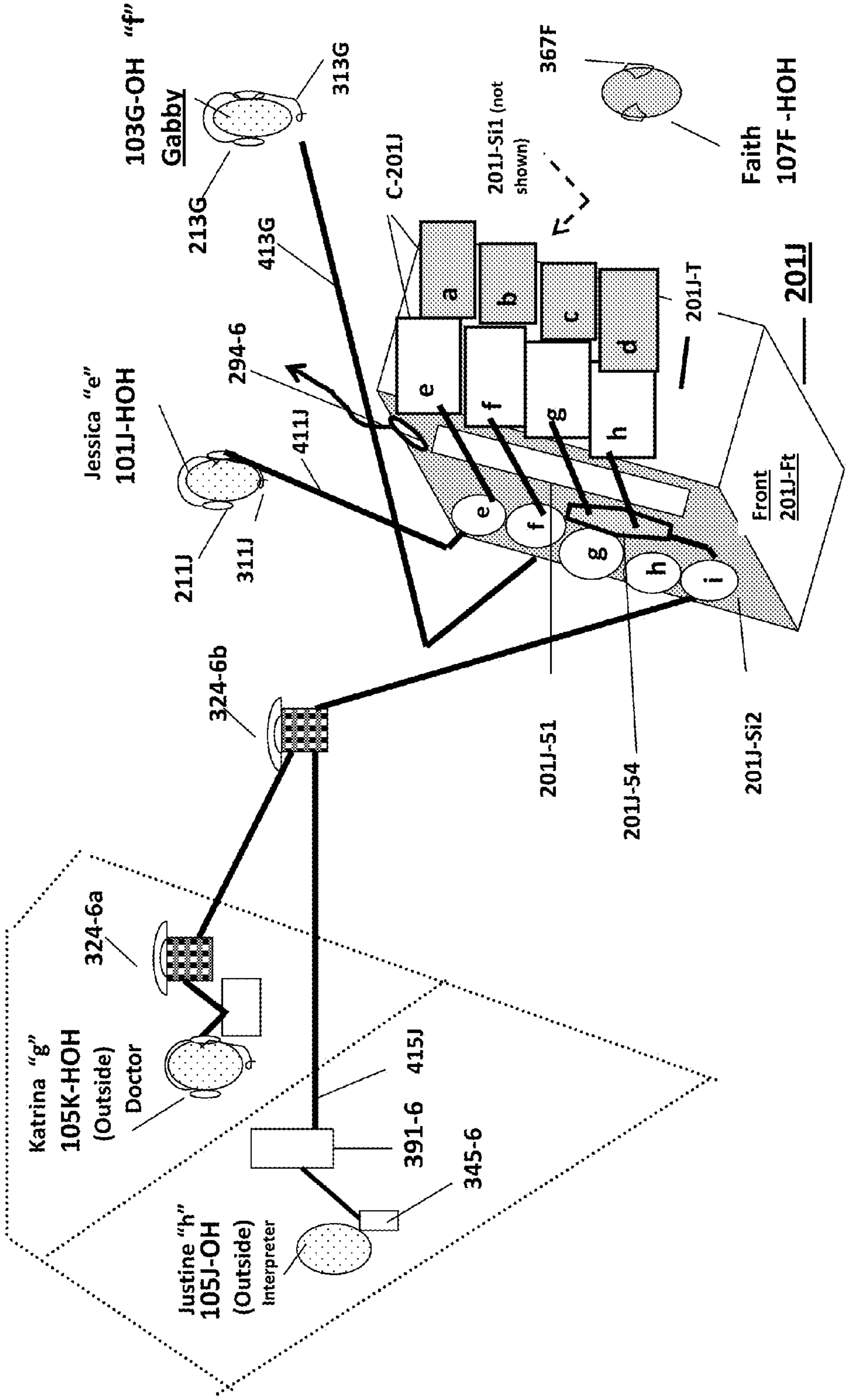
FIG. 6 is a schematic view of the third preferred embodiment of the invention, showing the operation of the unit in conjunction with phone operations in a situation where the hard of hearing person is talking to a professional, along with an interpreter, over the phone while he and a "helper" sitting next to him in the room use the system to communicate during the call.

The third preferred embodiment involves units that can be used in conjunction with telephony systems, allowing for more effective use of telephones and cell phones, especially for the hard of hearing user. In FIG. 5, the hard of hearing user is getting help from a friend while talking with a professional over the telephone. In FIG. 6, the hard of hearing user is communicating over the phone with a professional while using an interpreter accessed over the telephone.

Figure 7:
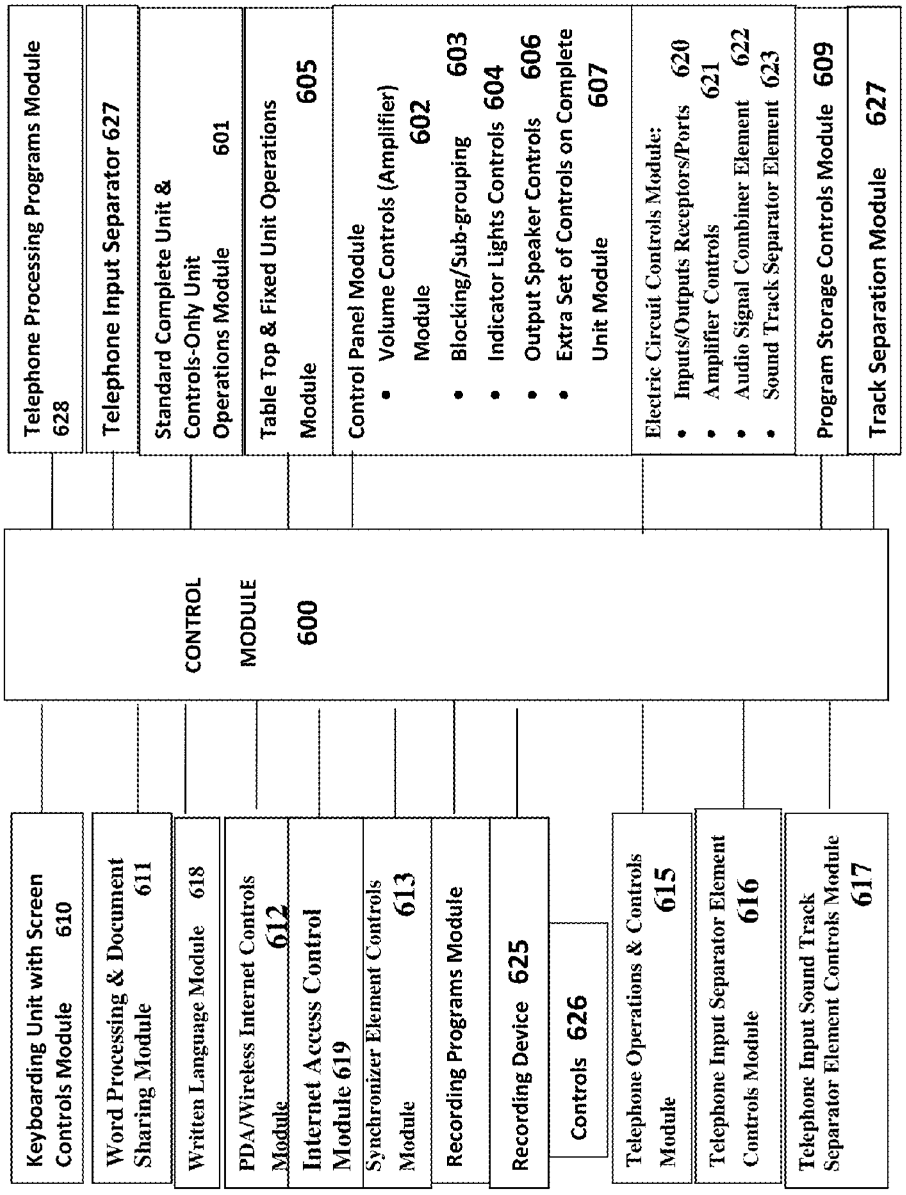
FIG. 7 is a schematic view of the control module for the computerized unit with screen and keyboard of the fourth preferred embodiment of the invention.
Figure 8:
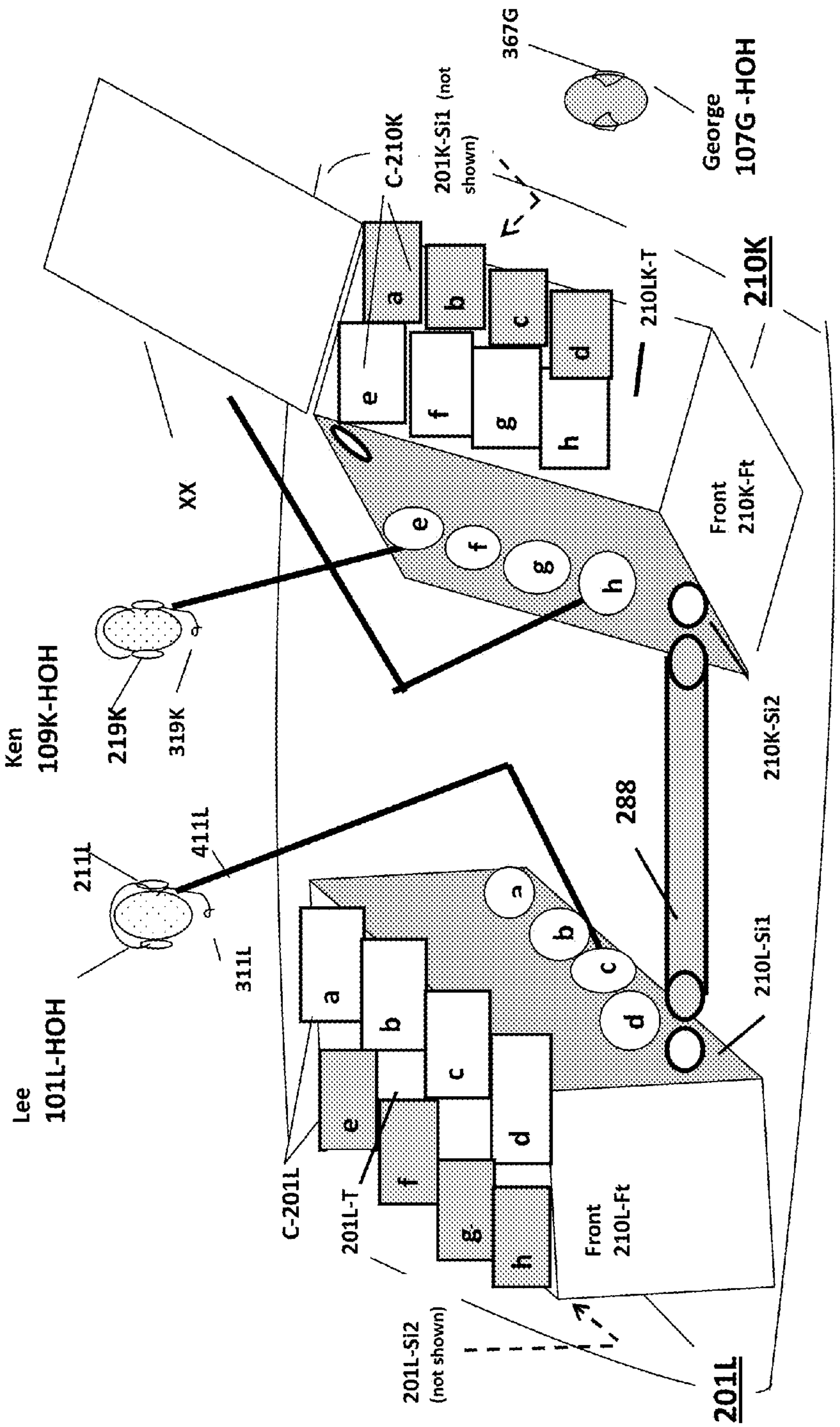
FIG. 8 is a schematic view of the fourth preferred embodiment of the invention, showing two hard of hearing operators of complete units watching a movie together while talking.
Figure 9:
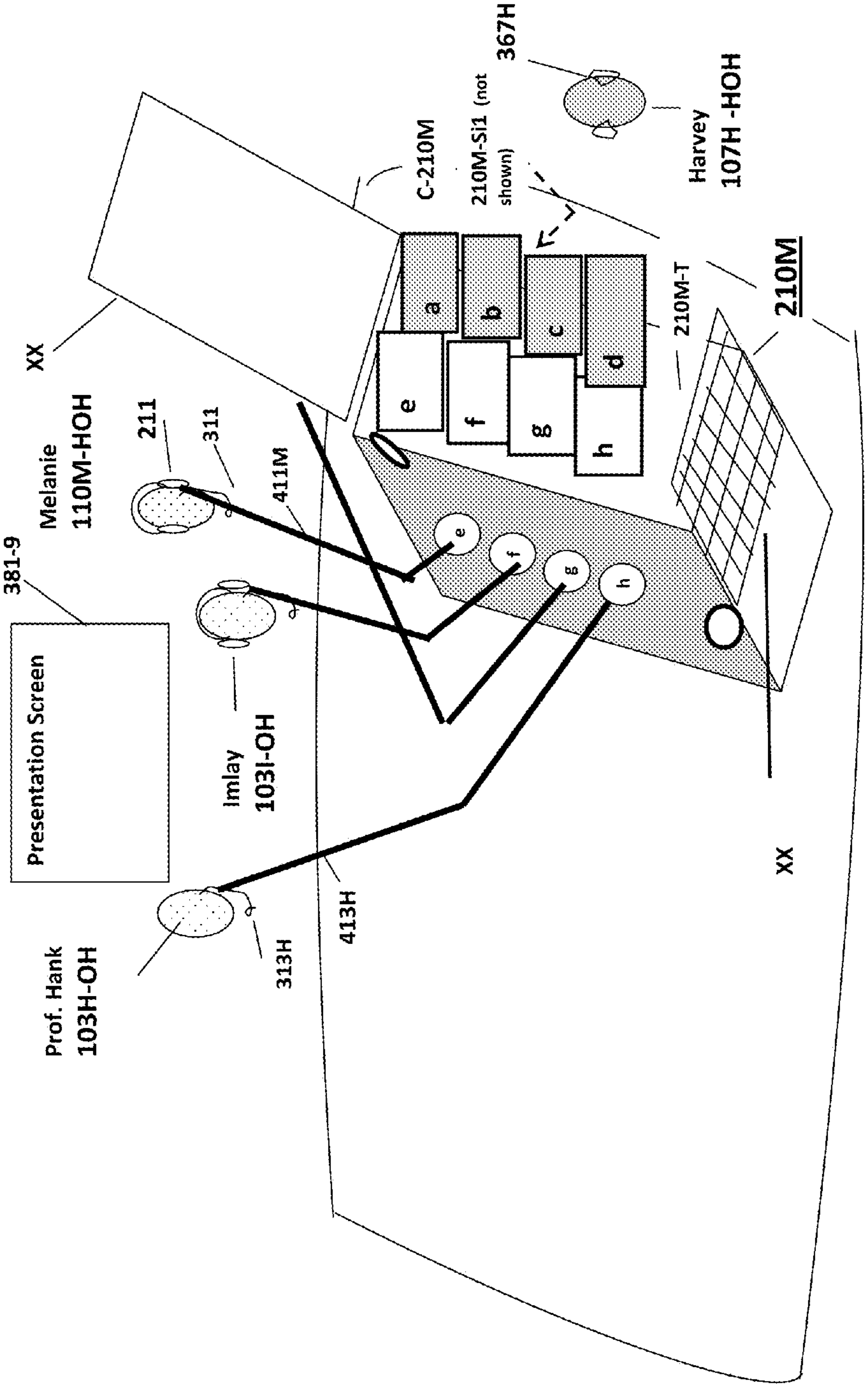
FIG. 9 is a schematic view of the fifth preferred embodiment of the invention, showing the unit with screen and keyboard with optional recording feature in a setting in which the operator is attending a lecture where a POWERPOINT presentation is being made.

The fourth preferred embodiment adds software and a mini-screen and keyboard to send visual material and text information along with auditory inputs to the user (FIGS. 7, 8 and 9). FIG. 7 shows the control module for the computerized operations of this embodiment. FIG. 8 shows two hard of hearing operators of complete units (one with screen, keyboard and computerized operations) being used to watch a movie together while talking. FIG. 9 shows one hard of hearing user with a single complete unit (with the screen and keyboard) watching and recording a POWERPOINT lecture.

Figure 10:
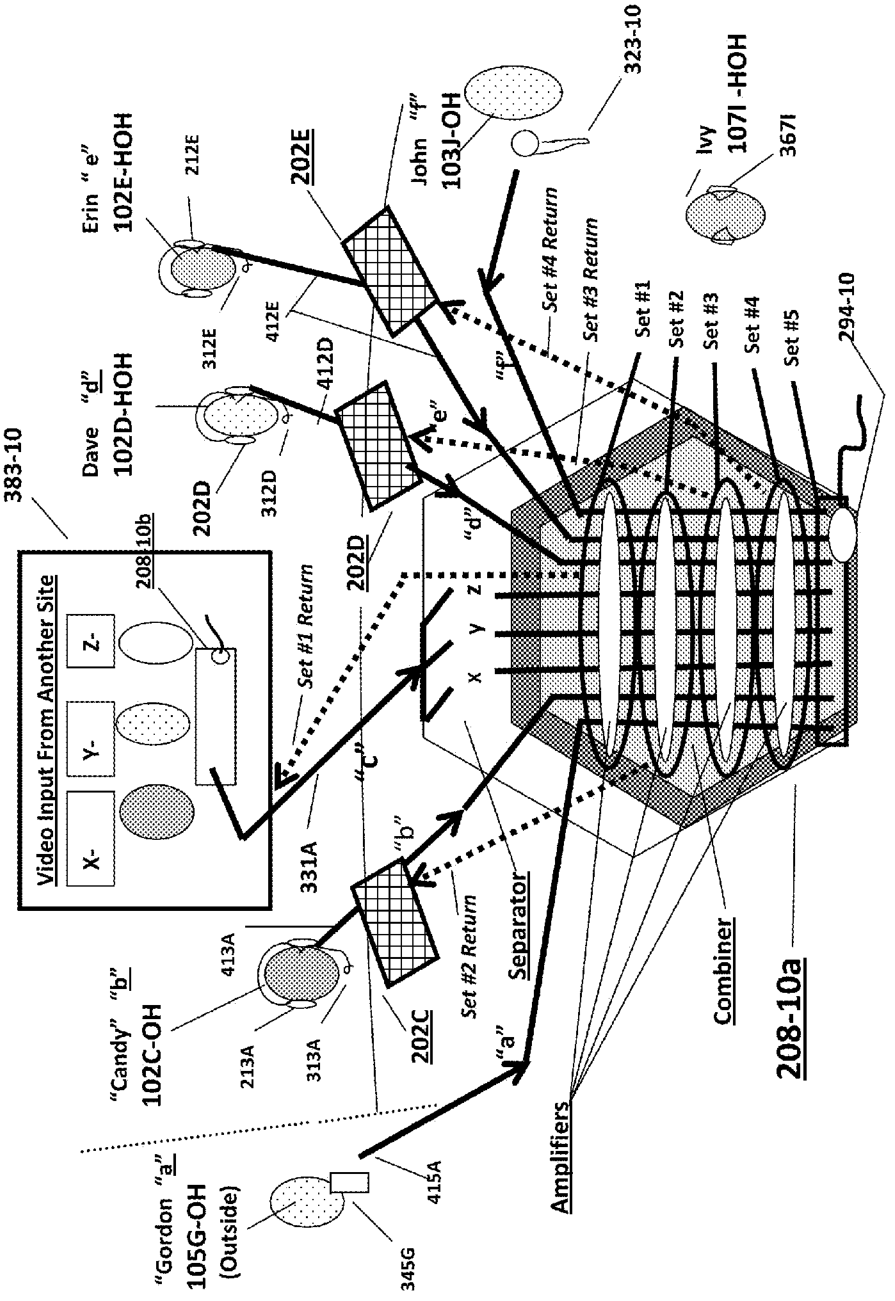
FIG. 10 is a schematic view of the sixth preferred embodiment of the invention, showing operation of the table top unit being used in conjunction with teleconferencing in a business setting.
Figure 11:
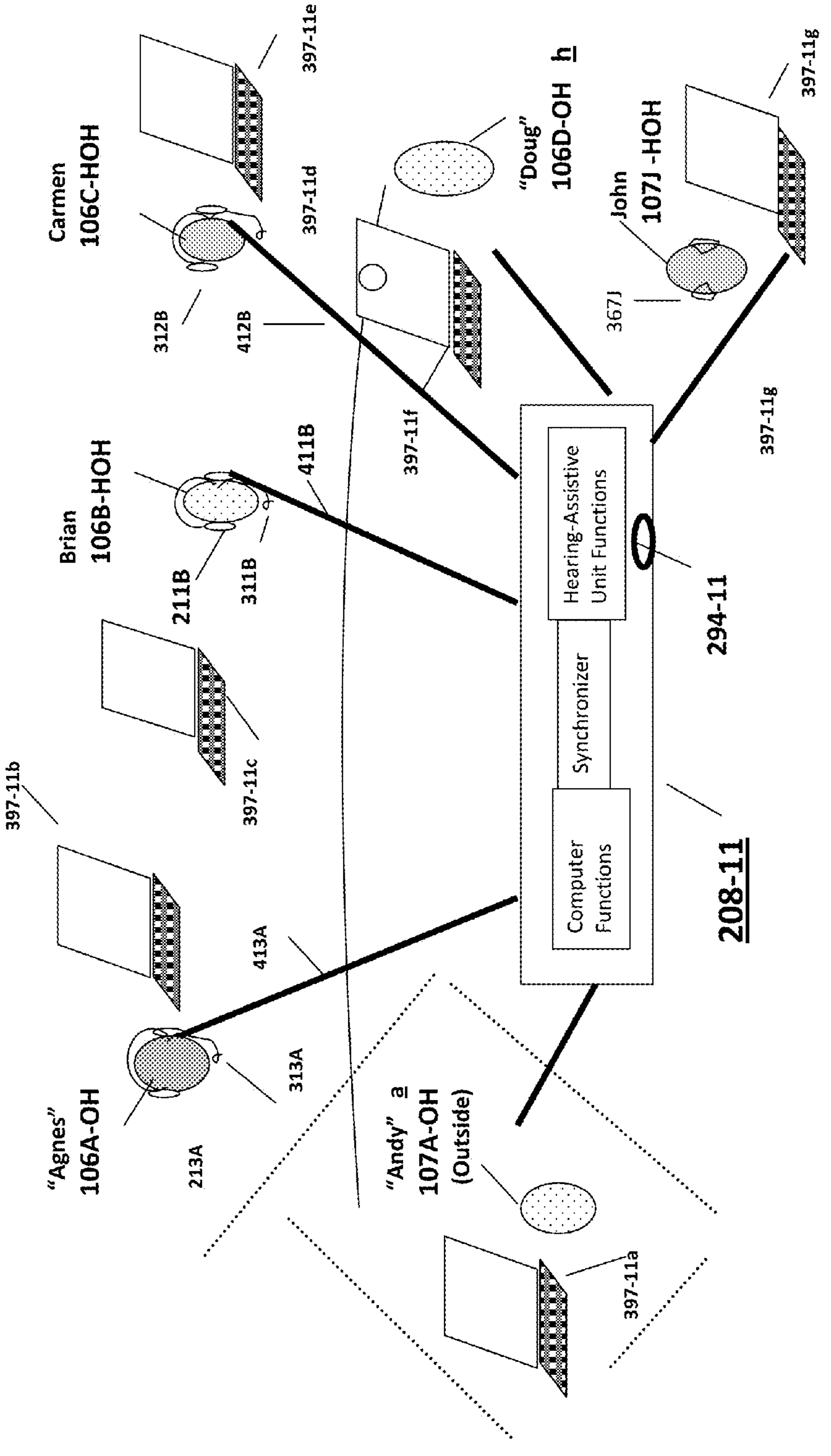
FIG. 11 is a schematic view of the sixth preferred embodiment of the invention, showing operation of the system with units having screens and keyboards being used in conjunction with a business meeting taking place around a rectangular table.

The fifth preferred embodiment involves a table top unit with multiple input capacities (FIGS. 10 and 11). In FIG. 10, the table top unit is being used for a teleconferencing session; and in FIG. 11, the table top unit is being used for a meeting which includes both hard of hearing users and persons of ordinary hearing. The system of this embodiment could be built-in to the table and remain stationary and ready whenever there is a business meeting.

The sixth preferred embodiment (FIG. 12) involves a unit that can be used while working in a noisy environment requiring access to different types of communication (such as face-to-face with a customer, answering a cell phone call, and attending to an intercom).

The seventh preferred embodiment (FIG. 13) involves units that are fixed in certain, usually public settings with pre-determined input signals (such as those already positioned for use in theaters, lecture halls or stadiums).

The eighth preferred embodiment (FIG. 14) involves units that can be used in vehicles to enhance communication while driving, riding or parking.

The ninth embodiment (FIG. 15) involves units that can be co-located, embedded or connected in synchronous operation with other devices.

The present patent application also claims a unique method for providing a universal, hearing-assistive system of interconnecting devices, (similar in function but not necessarily identical in design to the portable hearing-assistive sound units of the present invention), for the purpose of improving the listening and communication experience of persons who are hard of hearing in diverse public and private settings.

Types of Hearing-Assistive Units:

The portable hearing-assistive units of the present invention can be wireless or wireline devices powered by batteries or electric current. They can be co-located or embedded in other programmable, computerized devices such as telephones, cellphones, PDA's, DVR's, IPOD's, televisions or computers. The units can be made of solid state electric circuitry, or they can be made up of digital microprocessors, or a combination of both types of components. Units can be equipped with a screen and keyboard so that their operation can be coordinated with other devices, thereby improving communication in many settings where smart phones, PDA's, and computers are used. The units can be light and portable and carried in an accessible shoulder bag or attached to a belt around the user's waist. The "table top" units have many receptor sites for voice inputs and can be integrated with business teleconferencing and meeting systems. The units can be fixed with specific features in settings designed for a specific purpose, such as in a theater or stadium or lecture hall. Finally, all units are either "complete" units or "controls only" units. Complete units contain the hardware and software to accomplish all of the functions of the units, as well as controls to operate all of the functions. "Controls only" units, in contrast, must be connected to a "complete" unit where all of the functions are performed, with the controls for those functions being located on the "controls only" unit and being operated by a different user.

Designations for Persons Using the Units:

Persons using the system who are operating a set of controls are called "operators". Persons who are "plugged in" to the unit but do not have controls to operate are called "participants". Participants may be connected to a unit via a microphone input only, or they may be wearing a headset containing microphone and headphones. Still other participants may not be wearing a headset at all but listening to what is going on with the persons using the unit via the "output speaker" from the unit. All of the operators and participants taken together are collectively designated as "users". There are also situations in which other persons are present, but are not involved in, the ongoing interaction with the connected units. These persons are identified as "others".

How the System Works:

Ideally, each person who is participating in an ongoing interaction with the system speaks into a microphone contained in a headset (with the headset consisting of a microphone combined with headphones). Each user's headset is "plugged in" to one of the connected units at each "user connection site" by wire line or wireless conduit. The system has the capacity to transmit multiple audio inputs at the same time between the connected units (via the inter-unit connector) and through each of the connected units. These audio inputs include the voices of other users coming from the microphone in each user's headset as well as audio inputs from television, stereo, radio, telephone or computer sources. The system allows the users to share the set of multiple audio inputs coming into any of the connected units at any one time by separately routing each audio input signal in its original form to each user's connection site. The set of multiple audio inputs can then be routed through an amplifier which is connected by electrical circuit to a set of controls laid out on a control panel (or screen), with said controls allowing each unit operator to continuously and separately adjust the volume of each incoming audio input signal, relative to the volume of the others, to his/her liking. From the amplifier, the electrical circuit then separately routes each operator's set of volume-adjusted incoming audio signals through a "sound blender" which separately combines each set into one signal, thereby creating a separate blended output signal for each operator, with said blended output signal uniquely representing the relative volume adjustments made by each respective operator. From this point, each operator's uniquely blended audio output signal is transmitted by electrical circuit from each operator's "user connection site" through each respective "user connector" to each operator's headphones.

Listening to the system's output coming from the connected units through headphones allows each operator to hear the desired blend of volume-adjusted inputs that he/she has created in real-time throughout the interaction, while effectively blocking out background noise from the environment. For example, the hard of hearing operator could have the audio input from another user's voice turned up to the highest level in relation to all of the other inputs coming into the system, thereby improving his/her communication experience, while the operator of ordinary hearing could create a more balanced blend of audio inputs at a much lower volume level. At the same time, the system ensures that other people nearby who are not involved in the interaction are not disturbed by their talking because the person of ordinary hearing using the system does not have to raise his/her voice in order to be heard by the hard of hearing user.

Another problem that the system addresses is how the hard of hearing person may sometimes speak very loudly because they do not realize how loud their own voice is since they cannot hear it that well. The present invention addresses this problem by providing an input from the user's own voice into the portable sound unit so that the user can adjust the volume of his or her own voice to match the inputs from other speakers in the conversation. Specifically, the user's headset is equipped with a microphone which provides an input into the portable sound unit system along with the inputs from the other speakers. The user can adjust the volume of his or her own voice to match that of the other people involved in the conversation, making it possible for the user to hear his or her own voice just as clearly as the other voices, without requiring anyone involved in the conversation to raise the volume of his/her own voice to uncomfortable levels in order to be heard.

In addition to the volume controls on the control panel of each unit, set buttons can optionally be provided to allow the operator to set the level of volume to be maintained for each input throughout the period of use. Indicator lights can also optionally be provided to give the operator information about which inputs are "on" in the overall system, which users are having a separate private conversation, and which persons are trying to get the operator's attention.

There are a number of other optional features which can increase the effectiveness of the system for improving the communication experience of the hard of hearing user which will be discussed as they are used in combination with each of the preferred embodiments described in detail below.

II. First Preferred Embodiment

Portable Hearing-Assistive Sound Unit System with Inter-Connectible Units in Two Settings Description:

The first preferred embodiment of the present invention consists of inter-connectible, portable devices or "units", with each unit being capable of transmitting multiple audio signals at the same time (including a separate input for each of the voices of two or more users involved in the interaction as well as inputs from other sound sources), which can be shared by all persons using any of the connected units; and, with the person operating the controls of any of the connected units having the capacity to separately and easily adjust the volume of each audio signal coming into any of the connected units as frequently as desired, over the duration of the interaction.

This embodiment of the invention improves the listening experience for the hard of hearing user in two major ways: it allows him/her to differentially adjust the volumes of inputs so that one input can be heard more clearly over another; and it allows him/her to engage in a conversation with a smaller subgroup of people for a time, and then to shift back to having a conversation with the larger group when desired. Optional features include the ability to engage in a separate conversation with an incoming cellphone caller while continuing to be "plugged in" to the group discussion. Another optional feature involves an enhanced control panel which allows users to pre-set the volume levels of all inputs for extended periods and/or provides them with visual signals indicating when someone would like to get their attention or when other users are involved in a "private" conversation.

The advantages of the first preferred embodiment over the prior art are demonstrated in two settings: i) while dining in a noisy restaurant and ii) while meeting with a doctor and a helper in the office.

Operation of System with Inter-Connectible Units in First Setting:

i) while Dining in a Noisy Restaurant:

FIG. 1 provides a schematic of the first preferred embodiment in which three hard of hearing persons, along with four persons of ordinary hearing, are using two complete units to communicate while dining together in a noisy restaurant. In addition, there is one more person who is hard of hearing dining with the group, and this person is wearing hearing aids (Aribelle 107A-HOH). Alice (101A-HOH), who is hard of hearing, is operating Unit 201A; and Bob (101B-HOH) who is also hard of hearing, is operating Unit 201B. There are also two people operating controls only units. Controls Only Unit 202A is being operated by Ann who has ordinary hearing (102A-OH); and the other controls only unit (202B) is being operated by Betty who is hard of hearing (102B-HOH). The complete units and the controls only units are each connected to a set of controls. Alice 101A-HOH is the operator for Unit 201A with set of controls C-201A; Bob 101B-HOH is the operator for Unit 201B with set of controls C-201B; Ann 102A-OH is the operator for controls only unit 202A with set of controls C-202A; and Betty 102B-HOH is the operator for controls only unit 202B with controls C-202B. There are three other participants having ordinary hearing (OH) involved in the interaction as well (Arlene 103A-OH, who is present at the table and connected to one of the units via headset; Aaron 105A-OH, who is calling in from outside of the restaurant via cell phone 345A to Alice 101A-HOH; and Bill 103B-OH, who is the waiter who briefly interacts with the diners using a directional microphone inputted into unit 201B). In addition to the people using the units, there are four other persons who are sitting at another table (lower right hand corner of FIG. 1), who are not participating in the interaction; these persons are designated as "Others" (Arnie 104A, Bruce 104B, Candy 104C and Debbie 104D).

User Voice Inputs:

A number of the audio inputs into the connected units shown in FIG. 1 come from the directional microphones in the headsets worn by each of the users. The audio signal from each user's voice is routed via the "user connector" to each person's "user connection site". In FIG. 1, Alice 101A-HOH (depicted third from the left in FIG. 1) is wearing a headset with headphones 211A and microphone 311A, connected to "complete" unit 201A (pictured on the left side in FIG. 1) at user connection site "c" through "user connector" conduit 411A, which provides Input "c" from the panel of input identifiers 501A in this example. Bob 101B-HOH (depicted fifth from the left in FIG. 1) is wearing a headset with headphones 211B and microphone 311B, connected to complete unit 201B (pictured on the right side in FIG. 1) at user connection site 511B through "user connector" conduit 411B, which provides Input "e" 501B in this drawing. Ann 102A-HOH (depicted fourth from the left in FIG. 1) is wearing a headset with headphones 212A and microphone 312A, connected to controls only unit 202A (pictured in the center in FIG. 1) which is routed to complete unit 201B at user connection site "f" through "user connector" conduit 412A, which provides Input "f" 501B in this drawing. And Betty 102B-HOH (depicted sixth from the left in FIG. 1) is wearing a headset with headphones 212B and microphone 312B, connected to controls only unit 202B (pictured toward the right in FIG. 1) which is routed to complete unit 202B at user connection site "g" through "user connector" conduit 412B, which provides Input "g" 501B in this drawing.

There are three other voice inputs into the system in FIG. 1. Arlene 103A-OH (depicted second from the left in FIG. 1) is wearing headphones 213A and microphone 313A, connected to complete unit 201A via user connector conduit 413A at user connection site "b" 501A in this drawing. Aaron 105A-OH (depicted first from the left in FIG. 1) is calling in on a cell phone 345A from outside the restaurant, providing Input "a" 501A in this drawing via wireless signal conduit 415A to user connection site "a" on complete unit 201A. And finally Bill 103B-OH (depicted seventh from the left in FIG. 1) is speaking into a directional microphone 323B via user connector conduit 413B providing Input "h" 501B in this drawing into complete unit 201B. Bill, the waiter, only uses the system briefly to speak to the diners about dinner specials. The rest of the time, Aribelle 107A-HOH, uses the microphone 327A which provides Input "h" 501B in this drawing into complete unit 201B.

Other Inputs:

There is also one non-voice audio input into the system. Alice 101A-HOH is operating an IPOD 331A which is connected to complete unit 201A via device connector conduit into device connection site "d" providing Input "d" 501A in this drawing.

User and Device Connectors and Inter-Unit Connector:

The user connectors contain two-way circuits which transmit voice inputs from the user microphones to the user connection sites, and they transmit audio output signals from the unit back to each user's headphones at the same time. The device connectors can also carry audio signals in both directions (depending upon the device). The inter-unit connector 288 carries audio input and output signals from one unit to another, making it possible for all users to share the audio signals being transmitted throughout the connected units.

Figure 1A:
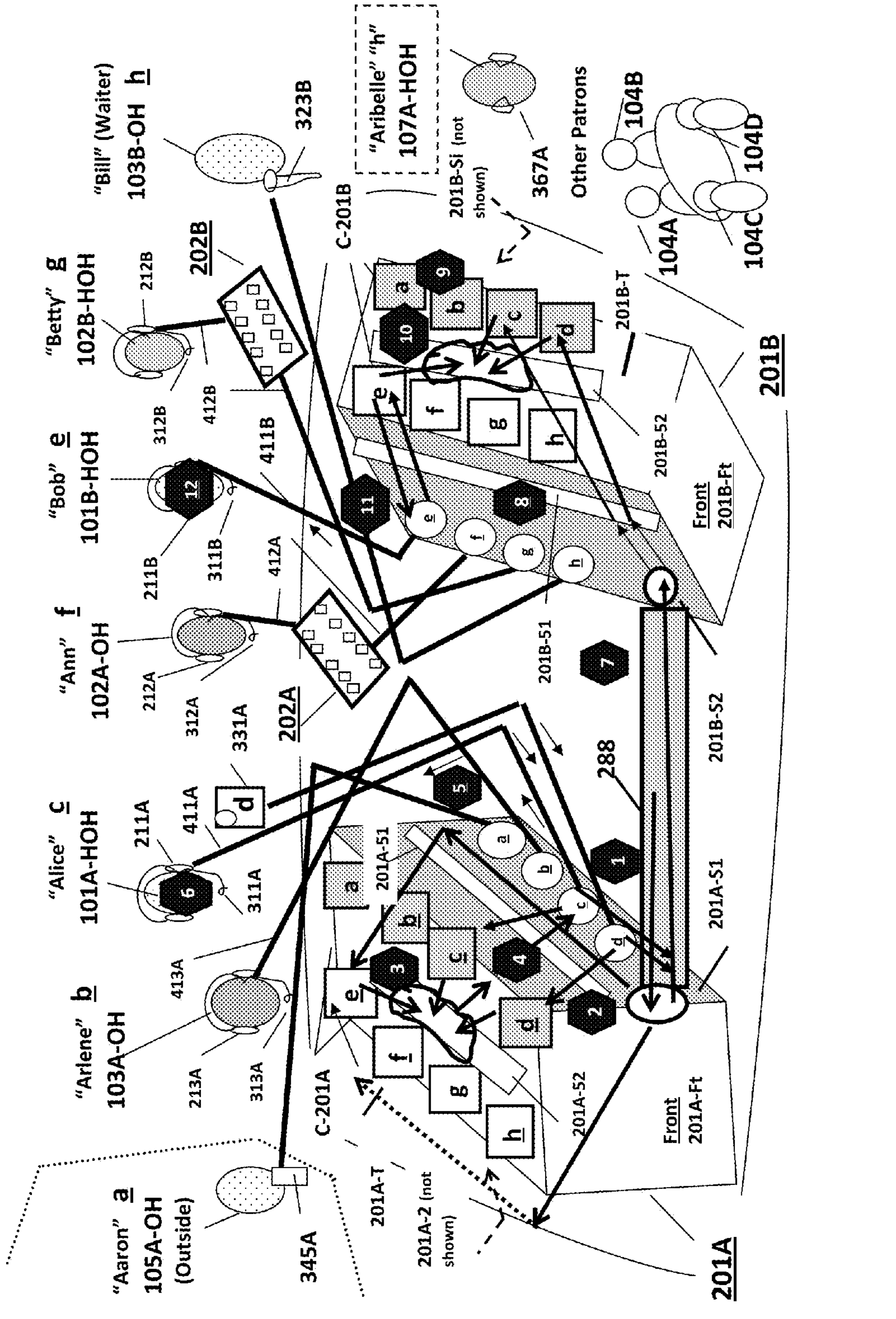
FIG. 1A is a schematic of the electrical circuit and components of the complete units and controls only units of the system as shown in FIG. 1.

Unit Internal Components and Design:

FIG. 1A shows the electrical circuits and components inside the connected units in operation during the interaction taking place in a noisy restaurant depicted in FIG. 1. Each complete unit 201A and 201B has a front (with 201A-Ft showing the front of Unit 201A and with 201B-Ft showing the front of 201B); a bottom 201A-Bt and 201B-Bt (not shown); two sides (201A-Si1 and 201A-$Si_2$ for unit 201A; 201B-Si1 and 201B-Si2 for unit 201B); a top (201A-T and 201B-T) and a back (201A-Bk and 201B-Bk). Each complete unit has connection sites for inputs on both sides in this illustration, with the connection sites for inputs "a", "b", "c" and "d" being located on Side 1 of unit 201A (201A-S1), and the connection sites for inputs "e", "f", "g" and "h" being located on Side 2 (201A-S2) of unit 201A. The connection sites on unit 201B for inputs "e", "f", "g" and "h" are located on Side 2 (201B-S2) and the connection sites for inputs "a", "b", "c" and "d" on unit 201B are located on Side 1 (201B-S1) (not shown).

Each input (including the voices of users and audio signals from devices) has its own connection site on one of the complete units. The specific input going into each connection site is designated by a letter in this drawing, with the same letter identifying (1) the source of the audio input (written next to the person's name or device, (2) the connection site for each input, and (3) the control on the unit for each input. The controls for each input (C-201A and C-201B) are located on the top of each complete unit (201A-T and 201B-T) in FIG. 1A and the control for each input is represented by a box with the letter of the input for which it controls written on it. Therefore, Input "a" into Unit 201A coming from Aaron (105A-OH) who is providing Input "a" into connection site "a" is controlled by the box identified as "a" on unit 201A. Input "b" into Unit 201A coming from Arlene (103A-OH) and going into connection site labeled "b" is controlled by the box identified as "b" in this example; and so on.

Inside each of the complete units is an amplifier 51 (represented by a long white box inside each unit in this drawing), with 201A-51 designating the amplifier for unit 201A, and with 201B-51 representing the amplifier for unit 201B. Each input signal is routed through the amplifier which is connected to the controls for each audio input on each unit. In FIG. 1A, the controls C-201A on Unit 201A are operated by Alice 101A-HOH, and the controls C-201B on Unit 201B are operated by Bob 101B-HOH. The operator of each unit can adjust the volume of each audio input by using these controls.

Also contained in each complete unit is a sound processing element that combines the audio inputs that have been adjusted by each operator into a single set of audio signals, with the set maintaining the relative volumes of each audio signal in the set as adjusted by the operator. This element is designated as the "sound combiner" 52, and is represented as a white box as seen through the top of each complete unit (201A-52 and 201B-52) in FIG. 1A. The sound combiner can be a device, circuit or computer program that is able to combine the volume-adjusted audio signals coming into the unit into a "set" unique to each operator which is then transmitted as a set back to the connection site of each operator, where it is routed through each operator's user connector and on to each operator's headphones, making it possible for each operator to continuously hear the combined personally volume-adjusted audio signals coming into the system all together. The set of audio signals may be heard as a "blend" of the volume-adjusted signals or as individual sounds being heard simultaneously by the operator via the headphones. In the case of participants who are wearing headsets connected to the system, but who do not have a unit with controls to operate, the sound combiner combines the unadjusted audio signals coming into the connected units into a set which is transmitted back to each participant's headphones.

Electrical Circuits Through Connected Complete Units:

FIG. 1A shows how inputs into connected units are transmitted through and between the units, using numbered steps (with each step depicted by black hexagons with the step number written on each one of them) to illustrate the process. FIG. 1A represents what is going on with the system being used by the persons in FIG. 1 at a specific moment in time. Starting at Step 1 (next to Unit 201A on the left), each audio signal coming from the connected Unit 201B is being transmitted through the inter-unit connector into the connection site on Unit 201A. At the same time, each of the audio signals coming into Unit 201A at that moment is entering that unit via user and device connectors, as illustrated by directional arrows in the drawing. At Step 2 each audio input is routed through the amplifier 201A-51 which is connected to the controls (C-201A) for Inputs 500 "a"-"h" in this example. At Step 3 each operator adjusts the volume of each input coming into the unit as desired, and the volume adjusted audio signals are then sent to the sound combiner 201A-52 where the volume-adjusted audio inputs are combined into a set. At Step 4 the set of volume-adjusted audio signals is routed to the connection site for the operator of unit 201A (101A-HOH "Alice"); at Step 5, the set of audio signals is routed through the operator's user connector 411A and at Step 6 to the operator's headphones 211A, where the set of audio signals is heard together by the operator 101A-HOH (Alice).

Starting with Step 7 in FIG. 1A, the electrical circuit continues through unit 201B, with arrows indicating the direction of the flow. Specifically, Step 7 (above the inter-unit connector 288 and next to Unit 201B) shows how audio signals from Unit 201A are transmitted into Unit 201B. At the same time, audio inputs are coming into Unit 201B via the user and device connectors that are connected to that unit. Step 8 shows each of the audio inputs being routed through the amplifier 201B-51, and at Step 9 each of the audio signals can be volume-adjusted by the operator. At Step 10 the volume-adjusted audio signals are routed through the sound combiner 201B-51 where they are combined into a set. At Step 11 the set of volume-adjusted sounds are routed through the operator's user connector 411B to his headphones 211B, where the combined set of volume-adjusted audio signals is heard by the operator ("Bob 101B-HOH).

Figure 1B:
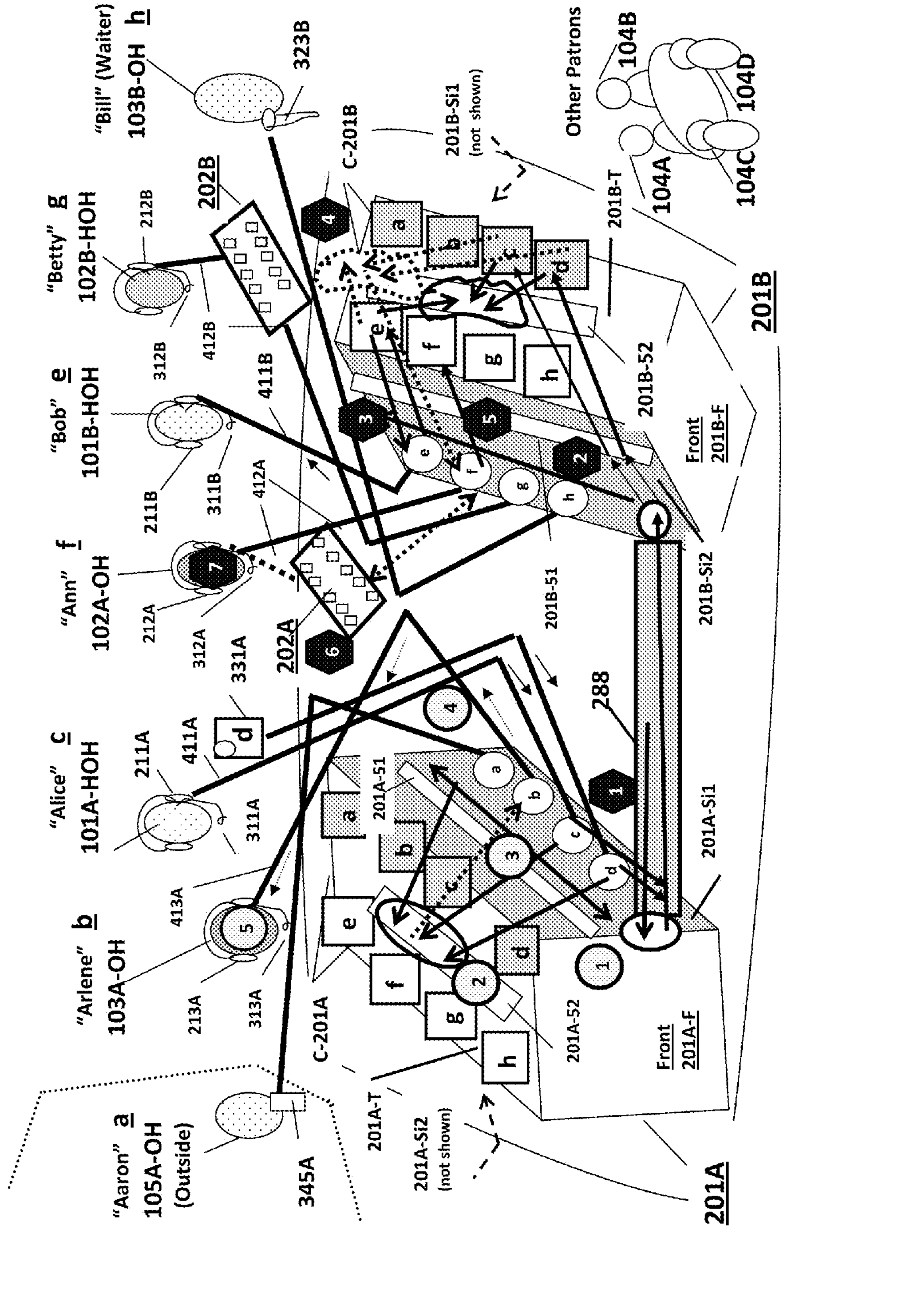
FIG. 1B is a schematic of the electrical circuit inside one complete unit and one controls only unit, showing transmission of audio inputs between units as shown in FIG. 1.

Electrical Circuits for Controls Only Units & Other Inputs:

FIG. 1B shows two sets of electrical connections (one identified by numbered steps in a black hexagonal shape, and the other identified by numbered steps in a light gray circular shape) based on the same persons as in FIG. 1 at a specific point in time. The hexagonal numbered steps represent the electrical connections between a controls only unit and a complete unit. Step 1 (located in this drawing next to Unit 201A) shows the signals from Unit 201A being transmitted through the inter-unit connector 288 into Unit 201B, as indicated by directional arrows in this drawing. Step 2 shows the audio signals coming from Unit 201A and from the inputs into Unit 201B, being routed through the amplifier 201B-51 (Step 3). Step 4 shows how the set of volume adjusted audio signals from the operator of complete Unit 201B ("Bob" 101B-HOH) and the set from the operator of controls only Unit 202A ("Ann" 102A-OH) are combined separately by the sound combiner 201B-52. (The set of audio signals going to Bob 101B-HOH is represented by solid lines and arrows, and the set of audio signals going to Ann 102A-OH are represented by dotted lines and arrows.) Step 5 shows how the set of volume-adjusted signals is sent back to each operator. In the case of the operator of the complete Unit 201B ("Bob" 101B-HOH) the set is sent back through his connection site ("e" in this drawing) on through his user connector 411B and on to his headphones 211B. In the case of the operator for the controls only Unit 202A (Ann 102A-OH), the set of audio signals is routed through her connection site ("f" in this drawing) and on to her controls only unit 202A (Step 6) where she makes the volume adjustments to the incoming audio inputs that are sent back in a feedback loop to the Complete Unit 201B where they are processed by the amplifier and sound combiner located in complete unit 201B. The set of volume-adjusted audio signals are then sent to the operator of the controls only unit ("Ann" 102A-OH) where she is able to hear the personally volume-adjusted audio signals at the same time through her headphones 212A.

The circular numbered steps in FIG. 1B represent the electrical connections between a complete unit 201A and a participant ("Arlene" 103A-OH) who is wearing a headset with headphones 213A and a microphone 313A. Step 1 represents all of the inputs coming into unit 201A from the other unit 201B and all the other inputs into unit 201A being routed through the amplifier 201A-51. In the case of the participant "Arlene" 103A-OH, she does not have controls to adjust the volume of each input. Therefore, the audio signals pass through the amplifier without adjustment. Step 2 shows how these unadjusted audio signals are routed through the sound combiner 201A-52 where they are combined into a single set of unadjusted audio signals. Step 3 shows the set of audio signals then being routed to Arlene's user connection site ("b" in this example) indicated by a dotted arrow. Step 4 shows the set of audio signals being sent via her user connector 413A back towards Arlene's headphones. And Step 5 shows the set of signals having reached Arlene's headphones 213A, enabling her to hear the set of unadjusted audio signals all at the same time.

Figure 1C:
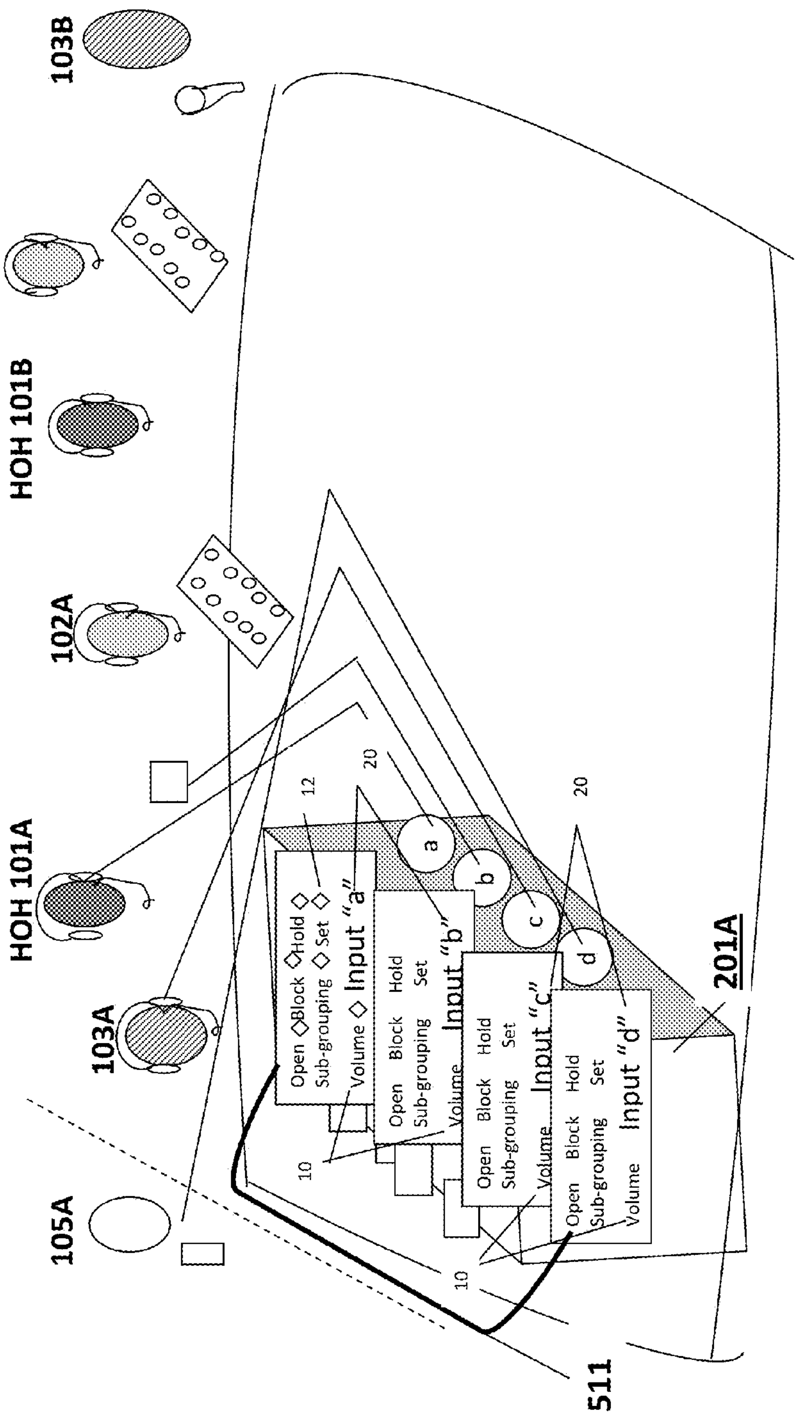
FIG. 1C is a detail view of an enhanced control panel for one of the complete units shown in FIG. 1.

The Control Panel 511:

FIG. 1C shows a close-up of the control panel 511 for complete unit 201A with users from the example in FIG. 1. The control panel 511 consists of a volume control 10 for each input 20. These volume controls can be knobs, digital arrows or LCD controls. Also on the control panel are set buttons 12 which allow the user to set the level of volume which he/she wants to maintain on each input throughout a given period of time. Also included on the control panel 511 are a set of three indicator lights with corresponding buttons 14 for each input. The three indicator lights show which inputs are "on" in the overall system, which inputs are in a subgroup conversation with the user, and which persons have asked or been asked to interrupt the user or join in the sub-conversation. Also on Control Panel 511 is a "Hold" button which allows the user to put one set of persons with whom he/she is interacting on "hold" so that he/she can communicate with another person connected in the system not involved in that particular conversation. Also on the Control Panel 511 there may be "set" buttons (not shown in the drawings) which allow the user to set the output volumes of inputs into the system for another user who does not have a fully operational or "controls only" unit. Each unit operator can adjust the volume of his/her own voice along with the other voice inputs into the system.

On the complete unit, it is optionally possible to include a second set of controls for another person who may want to use the hearing-assistive features of the system while interacting with the hard of hearing user.

Figure 1D:
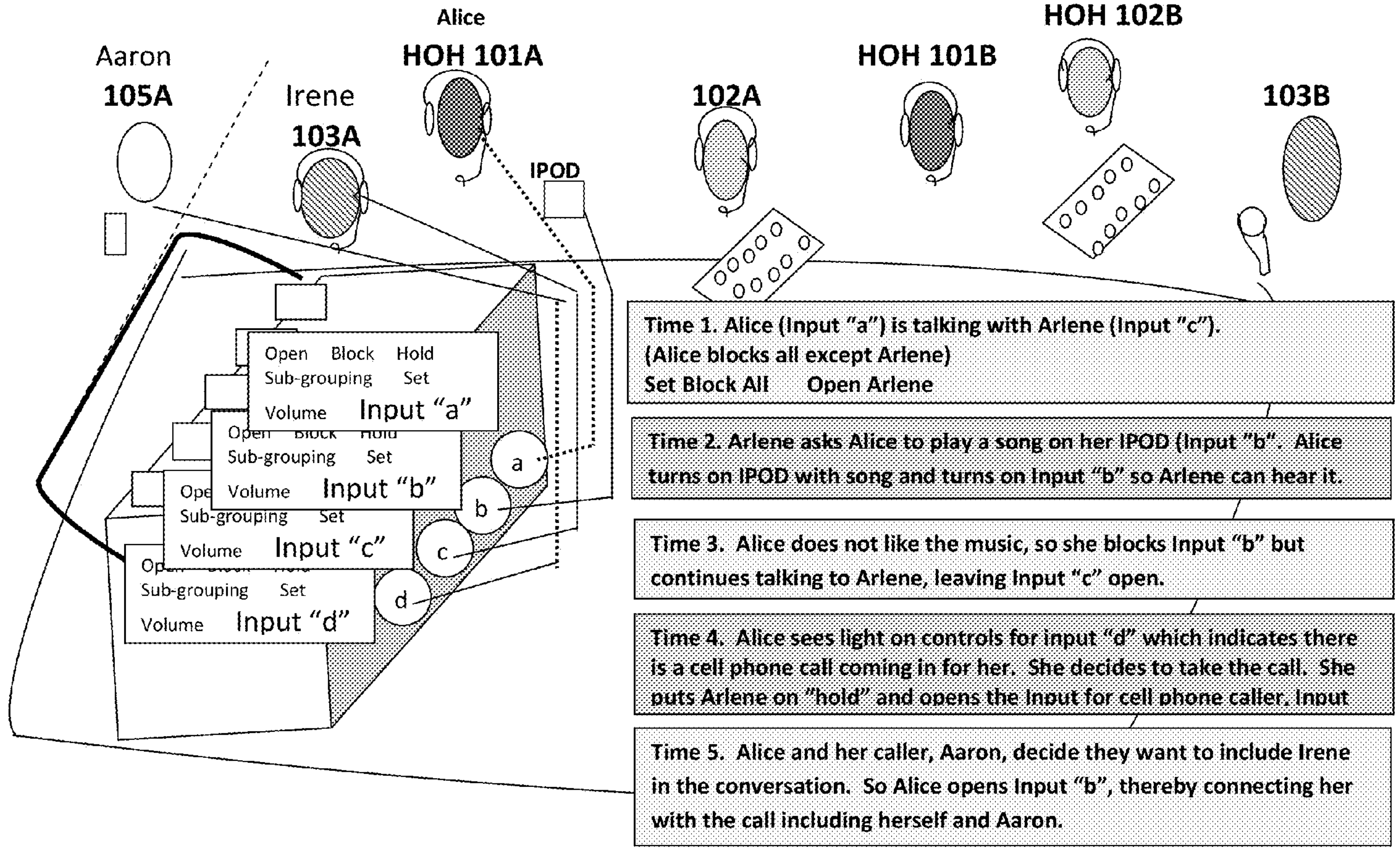
FIG. 1D is a detail view of the electrical circuits and controls for sub-grouping and blocking functions shown in FIG. 1.

FIG. 1D is a diagram of some of the persons in FIG. 1 using the control panel to sub-group and block inputs into the system during a specific interaction. The adjustments the operator (Alice) makes to control the inputs as desired throughout this interaction are shown at Time 1 through Time 5.

Operation of System with Inter-Connectible Units in Second Setting:

ii. While Talking with a Doctor in his/her Office:

Talking with a doctor in his/her office can be difficult for the hard of hearing patient. Sometimes people who are hard of hearing bring a friend or spouse in to the appointment with them to help. FIG. 2 depicts two complete units connected together and being used in a doctor's office to facilitate communication between a hard of hearing patient "Denise" 101D-HOH, the patient's "helper" (Cindy 103C-OH) and the doctor, Carla (101C-HOH). Also inputted into the system is an audiovisual presentation of an echo-cardiogram report being shown on a monitor 380-2 to the patient during the visit. FIG. 2 also shows how all of the inputs are made into the connected units in this example. Carla, the doctor 101C-HOH speaking into the microphone 311C produces Input "c" which is transmitted through the user connector 411C to her connection site labelled "c". The monitor device showing the ECG 380-2 produces Input "d" which is transmitted to connection site "d" on unit 201C. The patient, Denise 101D-HOH, is speaking into the microphone 311D and producing Input "e" into unit 201D, being transmitted through user connector 411D to connection site labeled "e" in this example. And Cindy 103C-OH, the helper, is speaking into microphone 323C producing signal "h" which is transmitted to unit 201D into connection site labeled "h". There is also another person, Bonnie 105B-OH calling into the system via cell phone 345B via wireless conduit 415B producing Input "a" into unit 201C and going into connection site labeled "a" in this example. A new feature is represented in FIG. 2, which is the outgoing speaker 294-2 (located on unit 201D) which continuously sends the set of unadjusted audio signals going on inside the system out into the room, enabling those who are not connected to the system via headphones to be able to hear what is going on.

The system in this setting allows the patient to hear the doctor 101C-HOH, the helper 103C-OH and the audio component of the ECG from the monitor clearly at the same time. The system also allows the helper 103C-OH, a person with ordinary hearing, to input her voice into the system so that the hard of hearing patient can differentially adjust the volume of her voice as desired. The helper can also hear everything that is going on within the system (the doctor and patient talking, as well as the ECG test) via the outgoing speaker 294-2 that sends the internal sounds out into the room. While talking to the patient, the doctor 101C-HOH gets a cell phone call from Bonnie 105B-OH. The doctor decides to accept the phone call, but puts the patient and helper on "hold" while she takes the call from Bonnie. The doctor, being hard of hearing herself, is able to function very well in this setting because she is using the system of the present invention.

In the far right lower corner of FIG. 2 is a person "Barbie" 107B-HOH who is wearing traditional hearing aids 367B. She is not connected to the system, but is represented in the figure to compare her experience with that of Denise. Barbie may have hearing aids that allow her to direct them to a specific target (such as to Denise or to the doctor), but these two people are in close proximity to one another, so it is unlikely that this would be a successful strategy to improve hearing for Barbie. Also, Barbie may have special connection that allows her to plug the sounds from the ECG directly into her hearing aid. While this may allow her to hear the ECG more clearly, it would make it difficult to hear the doctor who is talking about the meaning of the sounds and images while the ECG is playing.

III. Second Preferred Embodiment

Portable Hearing-Assistive Sound Units Used while Watching Television and Talking with Friends Description:

In the second preferred embodiment of the invention the hard of hearing person operates a portable sound unit which can be conveniently carried in a case attached to a belt and worn around the user's waist or carried in an easily-accessible shoulder bag. This embodiment of the invention is particularly useful in situations where the hard of hearing person wants to talk with a friend while listening to music or watching television together. The advantages of the second preferred embodiment over the prior art are demonstrated in two settings: i) while using two complete connected units to watch television together while talking (FIG. 3), and ii) while using one complete unit to watch television together with friends (FIG. 4). FIG. 3 also illustrates the optional features of having a telephone hook-up into the system, which allows the operator to take a phone call without interrupting the television program for the other people. In addition, FIG. 3 shows how the units can be equipped with an output speaker which sends the audio inputs into the system through a speaker out to the room, which allows persons who are not wearing headsets to hear what is going on. FIG. 4 shows the optional feature of using a sound track separator element to separate out different tracks from the television sound track (e.g. separating the speaker (voice) tracks from the background noise tracks). Once the tracks are separated, each track is transmitted to the amplifier connected to the controls where the operator can differentially adjust the volume of the speaker track (e.g. turning it way up) and the background track (e.g. turning it way down at least sometimes), improving his/her overall listening experience in this setting. FIG. 4 also shows how the omni-directional microphone which can be connected to the system is used to give the hard of hearing user some idea of what is happening in the immediate environment (in the room) even though he/she is using headphones while using the system which would make it difficult to hear outside sounds. This can be particularly helpful if the person is using the system and expecting someone to come knocking at the door or if the person is heating up the tea kettle and wants to hear when it is whistling.

Operation of the System in the First Setting:

i. While Watching Television with Friends Using Two Complete Units:

FIG. 3 provides a schematic of the system being used by several people who are watching television and talking together at the same time. Two hard of hearing persons ("Ed" 101E-HOH and "Fred" 101F-HOH) are using two complete units connected together. Ed 101E-HOH, the operator for unit 201E, provides Input "c" into unit 201E in this example; and Fred 101F-HOH, the operator for unit 201F, provides Input "e" into unit 201F in this example. Also present in the room is "Connie" 107C-HOH, who is wearing hearing aids 367C and is not connected to the system in this example, but is also listening to the television. Also inputted into the system is a high definition television set 382-3, which provides Input "d" into unit 201E. One new feature is represented in FIG. 3, which is an omni-directional microphone 323-3 which picks up sounds from the external environment and provides Input "h" into unit 201F in this example. Unit 201F is also equipped with an output speaker 294-3, which continuously sends the set of unadjusted audio signals going on inside the system out into the room, enabling those who are not connected to the system via headphones to be able to hear what is going on.

The system in this setting allows Ed and Fred to listen to the audio input from the television while watching tv and talking together at the same time. This is often not possible for hard of hearing persons, since if they wear headphones to hear the television audio track more clearly, they are not able to hear the person sitting next to them if something is said. Also, the hard of hearing user wearing headphones often speaks way too loudly, disturbing others who are watching the television who are not hard of hearing. But with the present invention, Ed and Fred are able to differentially adjust the inputs from the television sound track and the voice of the other person continuously throughout the period of use. Optionally, the units can be equipped with enhanced control panels having lights that indicate when one person using the system would like to talk to the other person while continuing to watch the television program. In addition, the omni-directional microphone input allows both Ed and Fred to be aware of sounds coming from the immediate environment (outside of their headphones) that they want to know about (such as a phone ringing or a tea kettle whistling).

As in other examples presented in this application, the system works in this example by having each input coming in to either of the connected units routed by electrical circuit through an amplifier connected to controls that allow the operators to differentially adjust the volumes of each input as desired; and then routing the adjusted inputs through the sound combiner element, which produces a set of audio signals that has been personally volume-adjusted by each operator, and then routing each combined set of audio output signals through the user connectors back to each operator's headphones.

By comparing the listening experience of Connie 107C-HOH, who is hard of hearing and wearing hearing aids, to that of Ed and Fred who are using the hearing-assistive system of the present invention, it is clear that Connie may have many difficulties understanding what is going on. Connie is able to hear all the inputs into the system together by listening to the output speaker 294-3. However, the combined sounds from the voices and the television are coming from the same proximity, so she would be unable to adjust her hearing aids to differentially hear one over the other. Compared to Ed and Fred who are using the system of the present invention, her listening experience would be significantly less satisfying.

Operation of the System in Second Setting:

ii. Watching Television with Friends while Using One Complete Unit with Sound Track Separator Element:

FIG. 4 provides a schematic of the system being used by several people who are watching television and talking together at the same time. One hard of hearing person ("Greg" 101G-HOH) is operating complete unit 201G, and providing Input "e" into unit 201G in this example. "Eve" 103E-OH is connected to the unit 201G via headphones 213E and microphone 313E, and provides Input "f" into unit 201G in this example. Also watching television with Greg and Eve is "Dinah" 107D-HOH who is wearing hearing aids and is not connected to the system. Included in this example is the output speaker 294-4 which sends the sound going on within the system out into the room. One non-voice audio input coming into the unit is the HDTV 382-4 which provides input "i" into the system.

One new feature which is represented in FIG. 4, is a digital sound mastery element called the "sound track separator" in this patent application. In FIG. 4 the Sound Track Separator 201G-53 is represented by a white rectangular box seen through the side of unit 201G-Si2. The sound track coming from the HDTV 382-4 via device conduit into unit 201G consists of audio signals of speakers' voices as well as the audio signals for background music combined into one. The Sound Track Separator 201G-53 separates the combined sound track from the HDTV into two inputs: namely input "h" which carries the signal for the background music track of the television program, and input "g" which carries the sound track for speaking voices of the television program. Input "h" connects to control box "h" on control panel C-201G, and input "g" connects to control box "g" on control panel C-201G. This separation of the voice and background music tracks from the TV soundtrack makes it possible for the operator to differentially adjust the volume of the two tracks throughout the television program as desired. For example, Greg 101G-HOH can turn the volume of the voice track "g"

way up and the volume of the background music "h" way down in order to hear the speaking parts more clearly. This is a huge advantage because it can be difficult even for persons with ordinary hearing to hear the voice tracks from TV programs at times when the background music (or noise) becomes very loud. The system allows "Eve" 103E-OH to hear all of the unadjusted inputs into the system (including the TV inputs, Greg's voice input from his microphone, and her own voice input from her microphone (providing Input "f" into the unit). Dinah 107D-HOH who is wearing hearing aids, is able to hear what is going on within the system via the output speaker 294-4. But it is clear that she may have some problems deciphering what is going on since she cannot adjust her hearing aids to "near" and "far" modes, since all the sound is coming from one place. Neither can she differentially adjust the volume of the voice track and the background track from the television program.

IV. Third Preferred Embodiment

Hearing-Assistive Sound Unit with Phone Operations in Two Settings

Description:

The third preferred embodiment involves units that can be used in conjunction with telephony systems, allowing for more effective use of telephones and cell phones, especially for the hard of hearing user. This embodiment is particularly effective in addressing problems that the hard of hearing user experiences when talking over the phone with a professional, while having a friend in the room who is trying to assist with the phone call. While there are hearing aids of the prior art which are designed to help the hard of hearing user when communicating over the telephone, they are only minimally effective, whereas the units of the present invention are perfectly capable of addressing any problems in a comprehensive way.

The advantages of the third preferred embodiment over the prior art are demonstrated in two settings: i) while using one complete unit to talk with a friend who is present in the room and taking an incoming phone call at the same time (FIG. 5); and ii) using one complete unit to talk to a doctor and an interpreter over the phone, while a "helper" in the room who is connected to the unit provides assistance with the call (FIG. 6).

Operation of Hearing-Assistive Sound Unit System with Phone Operations in First Setting:

i. Talking with a Friend Present in the Room and Taking an Incoming Telephone Call at the Same Time:

FIG. 5 shows "Howie" 101H-HOH, who is hard of hearing, using one complete unit 201H, along with "Faye" 103F-OH, who has ordinary hearing, connecting to the unit via headphones 213F. Howie is the operator of unit 201H and provides Input "f" into the unit. Faye is a participant in the interaction and provides Input "e" into the unit. Edith 107E-HOH is hard of hearing and wearing hearing aids 367E. She is present in the room but is not connected to the portable sound unit 201H. However, she can hear what is going on inside the system from the Output Speaker 294-5. Ickabod 105I-HOH is a hard of hearing caller who is using his own complete unit 201I to assist with his call to Howie 101H-HOH, operator of unit 201H. Ickabod's call provides Input "i" into unit 201H.

The interaction in FIG. 5 starts out with Howie 101H-HOH, who is hard of hearing, using the system to have a conversation with Faye 103F-OH, who is not hard of hearing. While they are talking, Howie receives a phone call from cell phone caller Ickabod 105I-HOH. Howie opens the connection of Input "i" coming into his phone 324-5*b* into unit 201H so he can talk with Ickabod at the same time as he is talking with Faye. However, Ickabod who is the operator for complete unit 201I (located on the left side of FIG. 5), does not want Faye to hear the conversation he is having with Howie. Ickabod has a Phone Call Separator 201I-54 element in his unit, which can separate out the voices from more than one speaker coming into the phone 324-5*a* connection with Howie into Input "f" which is produced by Howie and Input "e" which is produced by Faye. Then Ickabod can use his enhanced control panel to block Faye from hearing his communication with Howie. At a point further in the conversation, Howie convinces Ickabod that they should be involving Faye in the conversation. So at that later point Ickabod uses his enhanced control panel to open the connection with Faye so they can all talk together. Meanwhile Edith 107E-HOH who is wearing hearing aids can hear what is going on via the Output Speaker 294-5 from unit 201H, may have difficulty hearing things clearly, as all of the sounds coming from the same place (the output speaker), so she cannot adjust her hearing aids for sound inputs that are near and far. And she cannot block out certain people in the room from hearing her conversation with one person and not the other.

Operation of the System with Phone Operations in Second Setting:

ii. Woods System of Interpreter Over the Telephone:

In FIG. 6, the hard of hearing user "Jessica" 101J-HOH is using one complete unit 201J to talk to a doctor "Katrina" 105K-HOH and an interpreter "Justine" 105J-OH over the phone, with a "helper" ("Gabby" 103G-OH) who is present in the room with Jessica 101J-HOH and connected to the unit 201J. Also present in the room is "Faith" 107F-HOH who is hard of hearing and wearing hearing aids. The Interpretor "Justine" 105J-OH is using the Woods telephone interpretation system 391-6 to interpret what Dr. Katrina 105K-HOH is saying to her patient Jessica 101J-HOH. Justine is producing Input "g" by speaking into a cell phone 345-6 connected to the Woods Interpretation System 391-6 which is transmitted to a telephone 324-6*b* connected to unit 201J, operated by Jessica 101J-HOH. Dr. Katrina is producing Input "f" into the unit 201J by speaking into a telephone 324-6*a* which is transmitted to the telephone 324-6*b*, said telephone being connected to the unit 201J. "Gabby" 103G-OH is connected to unit 201J by headphones 213J and microphone 313J only, and does not have controls. Faith 107F-HOH (who is hard of hearing and wearing hearing aids) is not connected to unit 201J, but she can hear what is going on through the output speaker 294-6, which sends the unadjusted sounds from the system out into the room.

Following the circuit from telephone 324-6*b* carrying phone Inputs "g" from Justine (the interpreter) and Input "g" from Katrina, (the doctor) on to where it connects into telephone receptor "i" on unit 201J, the circuit is then routed through the telephone Input Separator 201J-54 where the two telephone Inputs are separated and then routed separately through the amplifier 201J-51 which is connected to the controls operated by Jedssica 101J-HOH, by which she can differentially adjust the volume of each telephone input, as well as the input of her voice "e" and Gabby's voice "f" as desired.

Using the system is very helpful to Jessica since her doctor is a specialist who speaks only French, and Jessica speaks only English. During the interaction, Dr. Katrina speaks in French about the results of some tests that were done on Jessica. Then the Interpreter Justine restates what the doctor has said in English for Jessica and her "helper" Gabby 103G-OH. Jessica may choose to turn the volume of her doctor's voice way down in relation to the interpreter's voice, so as to hear the translation more clearly. If something is confusing to her, Jessica can ask her friend "Gabby" to explain further or Gabby can ask questions to help her understand so she can explain the results more carefully to Jessica at a later time.

If the Woods telephone interpretation system was being used without the hearing-assistive sound unit system of the present invention, the voices from Justine, Katrina and Gabby would all be sent into the room from the speaker on the telephone 324-6*b* as one single sound source. It is very difficult even for persons having ordinary hearing to understand what is coming out of a speaker phone clearly. Using the hearing-assistive sound unit system allows Jessica to stay connected to the phone call and at the same time speak with a friend who is present in the room with her, which is a huge advantage of the system. On the other hand, if Faith 107F-HOH (who wears hearing aids) was the patient making this phone call, her hearing aids could improve the clarity of the speakers' voices over the phone since some hearing aids automatically adjust when using the phone (because of electromagnetic adjustments made when the hearing aid is in close proximity to the phone receiver). However, she would not be able to hear her friend "Gabby" very well while she was listening to the callers on the telephone. And Gabby would not be privy to what was going on during the telephone call except for what Faith could tell her. The present invention allows the patient, the friend physically present in the room, the doctor over the phone, and the interpretor over the phone to share all the inputs and differentially adjust the volume of each one as desired.

V. Fourth Preferred Embodiment

Networkable Hearing-Assistive Sound Unit System with Computer Screen and Keyboard in Two Settings Description:

In the fourth preferred embodiment of the invention, the portable units are equipped with a screen, keyboard and computer microprocessors hosting software that can send visual information through a mini-screen attachment to the units, enabling the user to view visual information while talking together with others. In this way, persons using the system can send photos to the mini-screen of all participants so that they can discuss this material while talking together using the system. This feature can also enable users to view, read and discuss written documents, thereby enhancing the hard of hearing user's interaction experience. This configuration can also allow users to have shared internet access and to view email and online slide presentations while discussing the material together. When the units are equipped with a keyboard and screen, the users can engage in both oral and written communication using the system. Word processing and document sharing software and "instant messaging" programs can be utilized while users are talking together and selectively controlling the various sound inputs as desired at the same time. This system can optionally be equipped with the capability to record all inputs (visual and audio) so that they can be played back at a later time by the hard of hearing user, (with the volume-adjustments remaining intact), thereby increasing his/her opportunities to review what he/she has heard and thereby improve comprehension.

Operation of Computerized Control Module for the Fourth Preferred Embodiment:

The fourth preferred embodiment adds software and a mini-screen and keyboard to send visual material and text information along with auditory signal inputs to the user (FIGS. 7, 8 and 9). FIG. 7 shows the control module for the computerized operations of this embodiment. The Control Module contains the program operations for all of the computerized sub-systems of the fourth embodiment. Each of these modules will be identified in the appropriate sections to follow.

Use of Standard Unit, Controls Only Units, Headphones & Ear-Pieces, Land-Line & Cell Phones, and Computerized Keyboard & PDA Models:

All the units and inputs can be used in conjunction with the fourth embodiment of the present invention. The system is engineered in such a way so as to understand what type of units, inputs and outputs are being used and adjusts the processing of the signals accordingly. Inputs and outputs can be hard-wired or wireless. Hearing-assistive sound units can also be hard-wired or wireless as well. When needed, adaptors are used to transform the signal from an input source into one that can be received by the system.

Volume Controls for Inputs and Outputs & Amplification Programs:

The volume of inputs and outputs and the amplification of these inputs and outputs is controlled by the volume control module 602.

Word Processing & Document Sharing:

In the configuration having a mini screen and a mini keyboard added to the basic system so that communication can be oral or written, word processing and document sharing software are controlled by written language module 618.

Instant Messaging, Internet Access Sharing, and Video Image Processing:

Another optional feature allows the user to integrate audio inputs with video and text inputs, thereby enhancing the hard of hearing user's ability to understand the audio inputs more clearly. The units can optionally allow shared access to the internet as well. These functions are controlled by Internet Access control module 619.

Recording Programs:

Another optional feature allows the user to record conversations (including audio, video, and text components) so that they can be replayed at a later time, thereby enabling the hard of hearing person another means to glean more information about what was communicated at a later time. These recordings can be made on DVDs or CDs or by digital recorder embedded in unit. The recordings can either be made of the original sound inputs or the adjusted sound inputs heard while the original interaction was taking place. These functions are controlled by the Recording Programs Module 624.

Recording Device:

All inputs can be processed through the recording device 625 and to the controls 626. Cassette tapes or DVDs can be used to record conversations and other media inputs and then played back at a later time.

Digital Sound Mastery Elements & Programs:

Optionally, the system can be loaded with currently available digital mastering software that can separate out the sound tracks of multiple track inputs (such as sound tracks coming from a television, stereo or telephone), and allow the user to selectively adjust the volume on each of the tracks separately (e.g. turning the voice track way up versus turning the background noise track way down) thereby enhancing the user's listening experience. These functions are controlled by the track separation module 627.

Telephone Processing Programs:

Inputs from standard land-line telephones as well as digital wireless cellphones can be processed by the units in several ways, and these functions are controlled by the Telephone Processing Programs Module 628. The telephone sound input can be adjusted for volume; it can be processed through the digital sound mastery elements to separate out the voices of speakers from background noise coming from the phone; and individual callers on a conference phone call (or party line) can be separated out by the system (with this function being controlled by Telephone Input Separator 627) so that each caller's voice volume can be individually adjusted as desired by the users. These functions are controlled by the Telephone Processing Programs Module 628. Other programs controlled by the control module 600 include the word processing and document sharing module 611, the standard unit and control-only module 601, and the keyboarding unit controls module 610.

The advantages of using the unit with screen, keyboard and computerized functions can be illustrated by discussing its use in two settings.

Operation of Connected Units (One Having a Screen, Keyboard & Computerized Operations) in the First Setting:

i) Two People Watching a Movie while Talking Together:

FIG. 8 shows two complete units (one unit with a screen and computerized functions) being used by two people to watch a movie together while they are talking together. Lee 101L-HOH, who is hard of hearing is the operator for unit 201L, and he is providing Input "c" into his unit (coming from his microphone 311L). Ken 109K-HOH, who is also hard of hearing, is the operator of unit 210K, a complete unit with computer screen attached. Ken is providing Input "e" into the system. The audio sound track coming from the movie being played on the video screen of unit 210K is producing Input "h" into unit 210K. Lee and Ken are using the system to differentially adjust the volume of the soundtrack input and the inputs of their own voices and the voice of the other person. George 107G-HOH, who is hard of hearing and wearing hearing aids, is watching the movie along with Lee and Ken, but he is not connected to the system. George is at a disadvantage because he must try to listen to the voices of Lee and Ken (and his own voice) while also listening to the sound track from the video. He must use the different channels of his hearing aids to try to target the desired sounds he would like to hear more clearly. But because the voices and the video soundtrack are all in close proximity to each other, he is not very successful at understanding a lot of what is going on.

Operation of System Using One Complete Unit (with Screen, Keyboard & Computerized Operations) in Second Setting:

ii) While Listening to a POWERPOINT Presentation in a Lecture Hall:

FIG. 9 shows several people who are at a lecture hall using the system to improve hearing and communication during a presentation by Professor Hank 103H-OH, who has ordinary hearing. Melanie 110M-HOH, who is hard of hearing and the operator of unit 210M, is talking with Imlay 103I-OH, who has ordinary hearing and is connected to the unit via headphones and microphone producing Input "f" into the unit. Prof Hank is producing Input "h" into the system, and the sound track from the video presentation 381-9 is producing Input "g" into the system. Melanie is also using her keyboard to take some notes on the lecture. She is also recording the audio inputs and the video inputs, with the personal adjustments she is making in the volume of the various inputs in real-time throughout the lecture.

The advantages of the system over hearing aids worn by Harvey 107H-HOH are numerous. Harvey has to separate out all of the audio inputs that are coming in from audio sources that are in close proximity to one another. He cannot adjust the volumes of the voices of other people in the lecture hall, the professor, or the soundtrack of the video presentation. Neither can he record the whole presentation with the personal adjustments that he needed to make in order to hear the presentation more clearly. Finally, he will not be able to re-play the recording in order to glean more information through repeated presentations, as Melanie will be able to do.

VI. Fifth Preferred Embodiment

Use of Table-Top Networkable Hearing-Assistive Sound Unit System for Use in Business Settings Description:

In the fifth preferred embodiment, a unit with multiple input capacity is equipped with enhanced telephony capabilities so it can be used in business settings for teleconferencing calls as well as virtual and real-life meetings involving persons who are hard of hearing and persons having ordinary hearing as well. This system could be built-in to the table and remain stationary so that the facilities would be ready whenever they were needed. This embodiment generally uses a table top unit having many possible input receptors for the voices of participants, whether they be voices from incoming phone calls, internet connections or the directional microphones from headsets of persons physically present in the room. Each incoming input is routed separately through the amplifier inside the table top unit (which is connected to each operator's controls), making it possible for the hard of hearing operator to turn the volume up on the voice of the speaker as loud as desired without having to disturb other people who are participating in the teleconference. The hard of hearing user can also engage in a private conversation with one or more users at the teleconference by turning down or blocking all the other users while engaging in this subgroup conversation. This is a very helpful feature since in large meetings people often break off into separate conversations, which can be very problematic for persons who are hard of hearing.

The table top version of this embodiment could be made stationary so everyone could plug in laptops and software around a large meeting table and the inputs and connections could be operated through computerized controls on the screen. The table top embodiment is used in much the same way as the connected units in the first preferred embodiment. Having the unit centralized allows for more inputs to be easily connected. One centralized processor can provide hearing-assistive technology to more people who require controls only units and/or microphones to participate.

In addition to the volume controls on the control panel of each unit, set buttons can optionally be provided to allow the user to set the level of volume to be maintained for each input; "block" buttons can be provided so that he/she can have a private conversation during an ongoing teleconference; and indicator lights can optionally be provided to give the user information about which inputs are "on" in the overall system, which inputs are in a subgroup conversation with the user, and which persons have asked or been asked to interrupt the user or join in the sub-conversation.

Large Screen Projecting Other Teleconferencing Participants from a Different Site:

This embodiment can be optionally equipped with a projection screen showing other participants in the teleconference located at a different site. The voice inputs from each person located at the other site can be sent into the table top unit where each input is separated and routed through the unit in such a way that the operator of each unit can differentially adjust the volume of each input as desired. The table top unit also may be equipped with an output speaker 294-10 which sends the sounds going on inside the unit out into the room, making it possible for everyone to hear what is going on, even those people who are not wearing headsets connected to the system.

Ear-Pieces & Headsets:

Hard of hearing persons or persons of ordinary hearing can choose to wear the ear-piece with sound input and microphone attached. This wireless device can allow the hard of hearing person the ability to be aware of all sounds from the environment while also hearing the adjusted sound inputs from the hearing-assistive sound unit as desired. It is also possible with the system of the present invention to set the volume of each sound input (as well as the volume of the combined sounds processed by the unit) for other participants. In this way, if a participant in the discussion does not have a fully operational unit or a "controls only" unit, the volume of the inputs and overall volume can be adjusted for that participant.

Telephone Input:

It is possible for the phone input to be processed by the digital sound mastery device of the hearing-assistive unit. (Not shown in FIG. 10.) When this feature is present, the sound input from the phone plugged into the unit is processed by the digital sound mastery system where the relative volume of the voice inputs can be turned up as compared to the volume of background noise (such as from a traveling automobile or background noise from a busy airport). This is a very nice feature because when someone is calling from a very noisy place, it is often impossible for even the person of ordinary hearing to be able to understand what is being said.

Operation of Table Top Unit in the First Setting:

i. While Participating in a Teleconference Session:

FIG. 10 shows a table top system with integrated large presentation screen and telephone operations being used for a teleconferencing session in a business setting. The enhanced operations of the fifth preferred embodiment (FIG. 10) allow different callers on a conference call (or party line) to be separated out so that the volume of each of their voice inputs can be individually adjusted as desired by users operating complete or controls only units. This feature is particularly helpful in a business setting where meetings often take place with distant workers utilizing cell phones or PDAs to participate in a meeting. The system can be networked with persons joining the teleconference from another site. In this case, a large screen 383-10 can project the images of the persons meeting at another site, and the table top unit being used at the other site can transmit the voice inputs of each of the persons at that site on to the table top unit 208-10 being used in FIG. 10. Then the Telephone Input Separator **208-10*a*-54 (not shown) can separate the incoming voice inputs and send them to different controls on the controls only units (202C, 202D and 202E in FIG. 10**), thereby allowing the operators to differentially adjust the volume of each voice input coming from the other site, as well as all of the inputs coming into the unit onsite, as desired. (Each operator can sub-group and block inputs from onsite inputs and the other site inputs as well.)

It is clear that the advantages of the system over conventional hearing aids are numerous. Ivy 107I-HOH who is hard of hearing and wearing hearing aids 367I in FIG. 10 will have serious problems being able to understand what is being said and who is saying it because she does not have the hearing-assistive capabilities of the present invention with its enhanced controls that can help to make sense of audio inputs and to control what aspects are to be targetted.

Operation of Table Top in Second Setting:

ii. While Participating in a Business Meeting:

FIG. 11 shows a table top system being used in a business meeting in which each person has a computer notebook with connections to the hearing-assistive system of the present invention. Voice inputs can come into the system from cell phones and computers offsite and microphones and other sources of sound on site. All of the hearing-assistive features of the system can be used in connection with other technological devices. This system provides many advantages for business, since it includes persons (associates or clients) who are hard of hearing and can integrate them with modern multi-media technology. It is clear that John 107J-HOH (who is hard of hearing and wearing hearing aids) in FIG. 11 may have serious difficulties hearing what is going on in this business meeting. John's hearing aids can be adjusted to target different sound sources. However, because many of the audio inputs are all together in the same proximity, it can be very difficult to separate out important sounds from other background or irrelevant sounds.

VII. Sixth Preferred Embodiment

Specially Configured Hearing-Assistive Sound Unit System for Use by Workers in Commercial Environments Description:

The sixth preferred embodiment of the present invention involves a specially configured unit for use by workers in commercial environments. This embodiment allows the hard of hearing person in a noisy work setting to be able to adjust the volume on voice inputs from customers who are physically present, incoming phone calls, co-workers communicating face-to-face or via phone or internet, announcements from the public address ("P.A.") system and communications via the intercom as desired, while blocking out background noise through the use of headphones.

Figure 12:
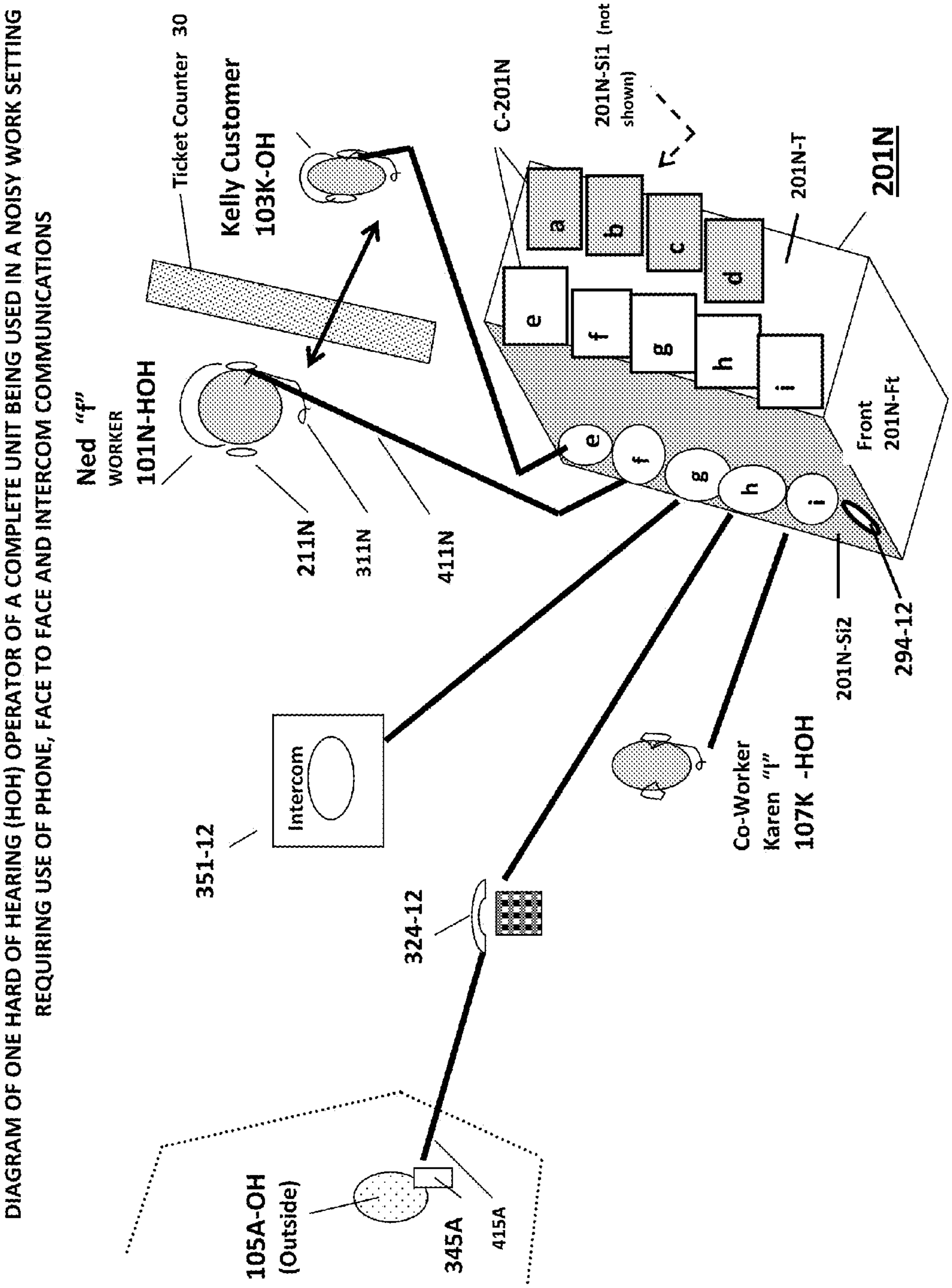
FIG. 12 is a schematic view of the seventh preferred embodiment of the invention, showing operation of the portable sound unit system in a work setting (with fixed inputs).

Operation of the Portable Unit by an Airport Ticket Counter Agent:

The sixth preferred embodiment involves a hearing-assistive system being used at an airport by a ticket counter agent who is hard of hearing. FIG. 12 shows a hard of hearing worker "Ned" 101N using a specially equipped portable hearing-assistive unit 201N at an airport ticket counter 30 while assisting an ordinary hearing customer who is physically present at the airport counter, Kelly 103K-OH. Both Ned and Kelly are wearing headsets with microphones, which block out the background noise at the airport. The special unit has three volume input controls, indicator lights/buttons, and a "hold" button. One input control adjusts the volume of the input being produced by the voice of Kelly 103K, which is Input "e" into the unit in this example. Another control adjusts the volume of the input coming from the intercom system, which is Input "g" in this example. And the other adjusts the volume of the input from the incoming telephone caller "h" in this example. Optionally, the system can be equipped with an input for the P.A. system at the site. The unit can be set up to automatically filter out background noise when speaking with an outside caller via the telephone, a co-worker via the intercom system, or with the customer. This system provides a means for a hard of hearing person to work in a setting which would not otherwise be possible. It is often difficult even for people of ordinary hearing to handle the multiple sound inputs at a job like this. Often workers wear ear-pieces through which they hear instructions from supervisors while they are trying to communicate with customers in a noisy environment where the phone is ringing and there are many people talking all around. There is no existing technology that provides this solution to problems confronted by the hard of hearing worker in this type of commercial setting as the present invention is able to do.

VIII. Seventh Preferred Embodiment

Hearing-Assistive Sound Unit System for Use in Movie Theaters

Description:

This embodiment can be used in a movie theater with fixed inputs and controls-only units allowing movie viewers to selectively turn up the voice track and turn down the background noise track from the multi-track sound input from the movie. This embodiment also allows users to talk together while watching the movie. (See FIG. 13.) In a movie theater, it would not be good to have a system that allows for people to keep talking while they are watching the movie. Therefore, if a hard of hearing person goes to the movie theater with a friend, it might be a good idea to bring his/her own portable hearing-assistive unit so as to be able to communicate with the friend prior to the start of the movie. When the movie is on, it would be better for the person to wear the headset provided so that the relative volume of voice and background sound tracks as well as the overall volume of the sound delivered through the headset can be adjusted as desired. This system can be very valuable to a hard of hearing person for several reasons. The multi-track sound input in the movie theater is often very hard to listen to because background noises (like crashes and explosions from the movie soundtrack) make it very difficult to hear the speaking parts from the sound track. Also, the volume of the movie sound track is often so loud that it is very difficult even for the person of ordinary hearing to be able to distinguish what is being said. There is no existing technology that provides this type of solution to the problems of the hard of hearing movie enthusiast.

Figure 13:
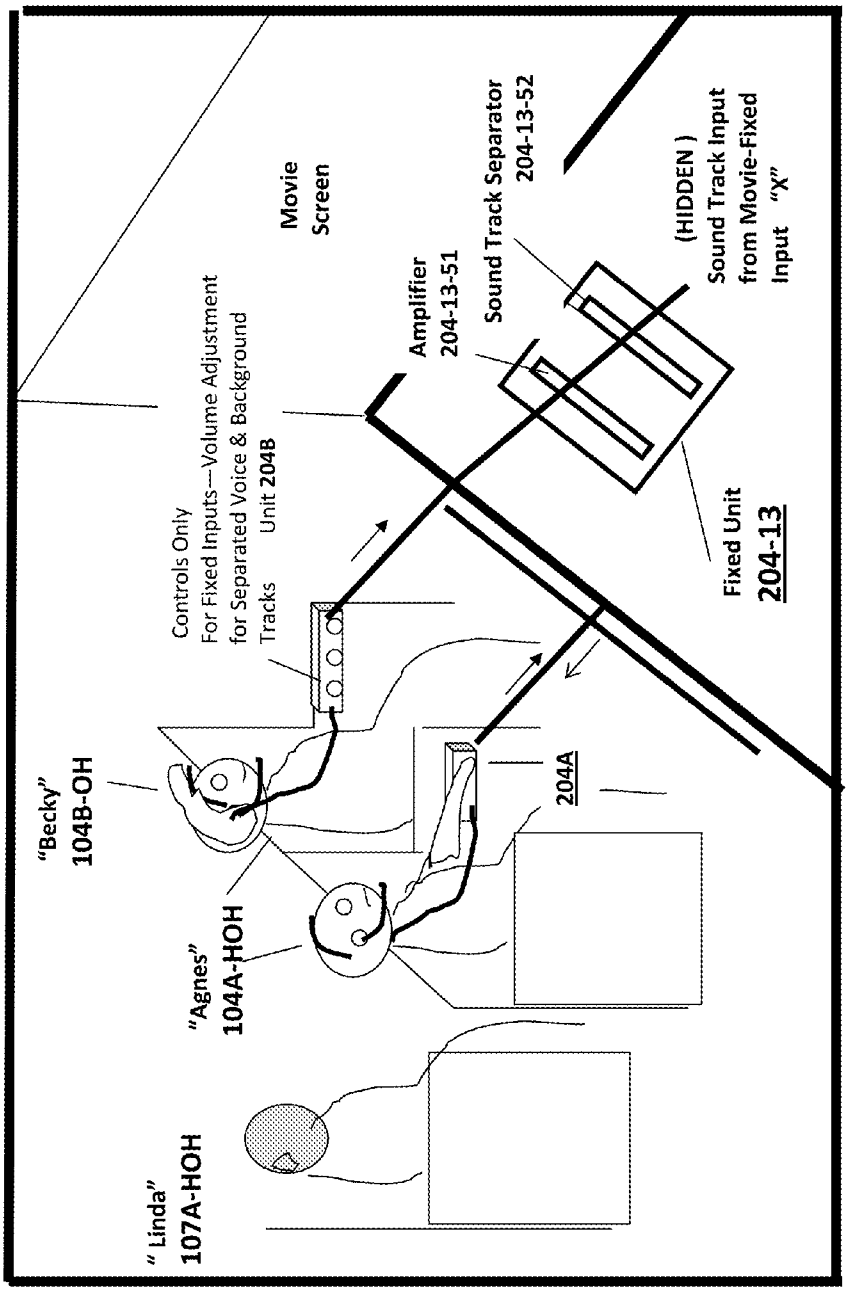
FIG. 13 is a schematic view of the seventh preferred embodiment of the invention, showing operation of the portable sound unit system in a theater.

Operation of the Hearing-Assistive Sound Unit System in a Movie Theater:

FIG. 13 shows three persons sitting in a theater watching a movie. The theater is equipped with a fixed input, stationary hearing-assistive sound unit system (whose components and connections are hidden from the theater-goers). The fixed unit 204-13 separates out the speaker track from the background track of the movie sound track, making it possible for each person sitting in a seat with a controls only unit (built into the space between the theater seats) to differentially control the volume of each separated sound track as desired throughout the movie. In FIG. 13, Agnes 104A-HOH is a hard of hearing operator of the controls only unit. She is using the unit to turn the volume of the speaker track way up and the volume of the background track way down, thus improving the listening experience of the movie. Becky 104B-OH is also using the system to turn up the speaker parts and turn down the background track when desired, even though she is not hard of hearing. Linda 107A-HOH, who is hard of hearing, is wearing hearing aids that can target sound sources that are near and far from her. Unfortunately, this does not do very much to improve her hearing experience since the targetting mechanism cannot turn up the speaker parts and turn down the background sound track when it gets too loud. Clearly, the hearing-assistive features of the present invention when used in a movie theater are highly beneficial to all users, and very superior to existing hearing aids of the prior art.

IX. Eighth Preferred Embodiment

Using the System in Vehicles

Description:

The eighth preferred embodiment involves units that can be used in vehicles to enhance communication while driving, riding or parking. In this embodiment of the invention, the unit can be integrated with other operating systems, including the GPS, cell phone and radio within the vehicle. The unit can also be equipped with an omnidirectional microphone which makes it possible for the driver to hear sounds from the environment (such as sirens) even when he/she is wearing a headset with headphones covering his/her ears while using the system.

Figure 14:
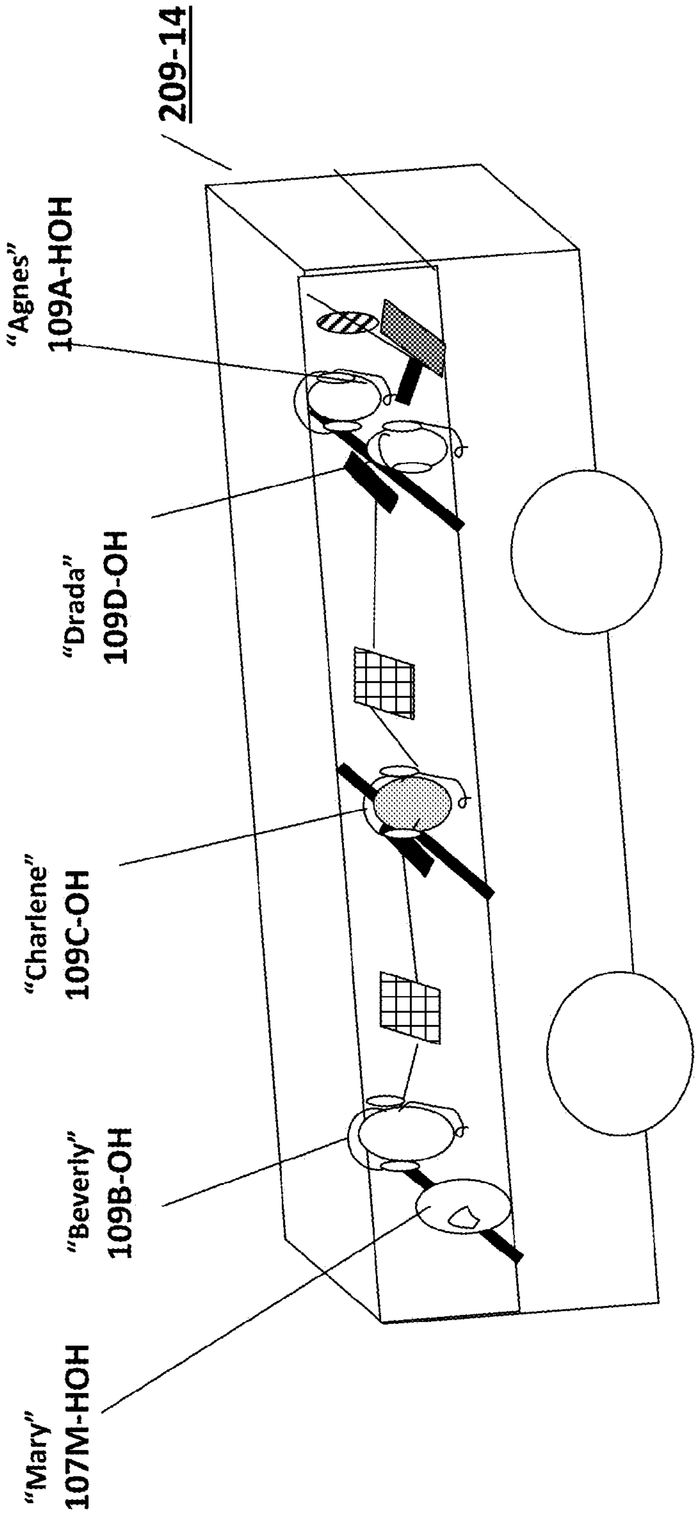
FIG. 14 is a schematic view of the eighth preferred embodiment of the invention, showing operation of the portable sound unit system in a vehicle.

Operation of the Hearing-Assistive Sound Unit System in Vehicles:

FIG. 14 is a drawing showing the use of the system while traveling in a large van with five people. The travelers are talking together using the system and listening to music, and operating the talking GPS system as desired. The driver, Agnes 109A-HOH is hard of hearing and is enjoying the freedom to talk with others and listen to music while driving without the usual difficulties. Connected to this system is also an omnidirectional microphone input which provides information to Agnes about sounds that are happening in the environment that may be important to her driving safety (such as sirens, beeping horns, etc.) Agnes also has a cell phone input into the unit which she can use to answer incoming phone calls while driving without disturbing other passengers or endangering their safety. Mary 107M-HOH is hard of hearing and wearing hearing aids. She is not able to have the same kind of listening experience while traveling with her friends because the hearing aids are unable to accomplish the hearing-assistive improvements provided by the system of the present invention.

X. Ninth Preferred Embodiment

Co-Locating, Embedding & Connecting System to Other Technological Devices

Description:

The ninth preferred embodiment involves units that can be co-located, embedded or connected in synchronous operation with other devices. This is an important capability of the present invention because many hard of hearing persons must interact with a world that is becoming more and more dependent on technological devices. Some examples of integrating the system with other devices have already been disclosed in this patent application. But FIG. 15 provides three examples of co-locating, embedding or connecting the portable hearing-assistive sound unit system of the present invention.

Figure 15:
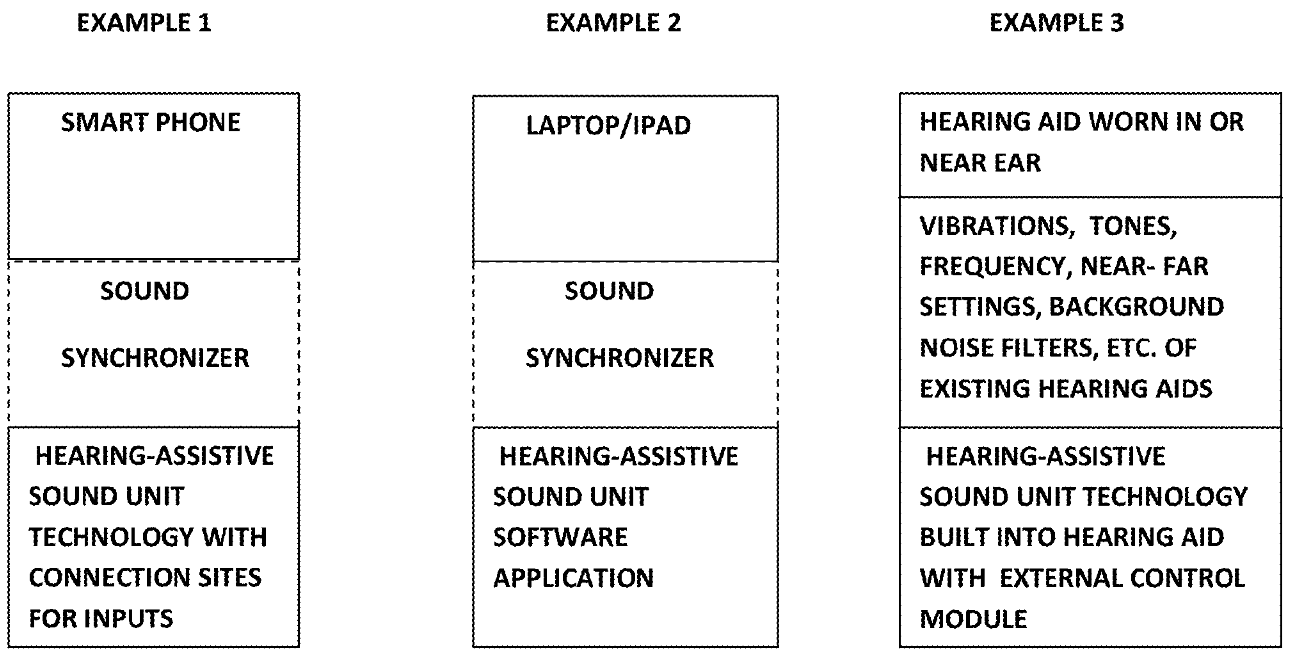
FIG. 15 is a drawing of three examples of the ninth preferred embodiment of the invention, which involves co-locating, embedding or connecting the technology of the portable hearing-assistive sound unit system with other communications and multi-media devices.

Operation of the Portable Networkable Hearing-Assistive Sound Unit System when Connected to Other Devices:

FIG. 15 provides three examples of how the portable hearing-assistive units could be combined with other devices in a synchronous fashion, thereby improving hearing and communication in numerous settings.

Example 1 shows a Smart Phone co-located with the portable hearing-assistive sound unit. Combining these devices would be very convenient, since the telephone functions of the present invention are highly useful, and having the devices combined into one would be much more convenient.

Example 2 shows a laptop computer combined with the hearing-assistive unit of the present invention. Combining these devices would bring about many efficiencies, since the hearing-assistive units work very well in conjunction with computer software programs and audio-visual programs.

Example 3 shows the combination of the portable hearing-assistive sound unit system with conventional hearing aids that are worn near or inside the ear canal. FIG. 15 shows how the advantages of hearing aids (such as using vibrations, tones, frequency, near-far, filters, etc.) in combination with the capabilities of the hearing-assistive technology of the present invention, would provide huge improvements for hard of hearing persons. This would allow persons who use specially fitted hearing aids to utilize the benefits of the present invention at the same time.

XI. Method for Standardization and Dissemination of the Present Invention

The present patent application claims a unique method for producing, standardizing and distributing the technology of the hearing-assistive sound unit system of the present invention so that communication can be universally improved for hard of hearing persons in diverse public and private settings. This unique method consists of the steps of:

1) Providing inter-connectible, hearing-assistive devices with technology that allows users to share multiple audio inputs and to differentially adjust the volume of each selected audio input coming into the devices as desired, allowing users to hear the combined sound of the personally volume-adjusted audio signals in real-time throughout the period of use;

2) Standardizing said devices, so they can be used in combination with other multi-media technology from Smart phones, computers, PDA's, IPODS, radios, stereos, DVD players and recorders, landline phones and cell phones, laptops, etc.; and 3) Disseminating said hearing-assistive technology in diverse public and private settings.

XII. Summary of Advantages of System and Method Over Prior Art

This patent application has described numerous settings where the hard of hearing person (or the person of ordinary hearing in a "hard to hear" setting) could benefit from the unique portable hearing-assistive sound unit system of the present invention. These settings include when hard of hearing persons are conversing in groups or subgroups in a noisy environment; when they are watching television with others; when they are talking in mixed groups of persons who are hard of hearing with those who are not; when communicating with professionals; when a foreign language interpreter is required; when talking on the telephone; while traveling in a car and talking with others at the same time; while watching a movie in a theater with a friend; while attending a lecture in a large auditorium; while visiting a sports arena; while communicating with a bank teller or an airline ticket agent; and while working. This patent application has also shown how attempts in the prior art to address the problems faced by hard of hearing persons in these diverse settings have been only minimally effective, if that. This patent application has also disclosed a unique method for providing inter-connectible devices comprised of the hearing-assistive technology of the present invention to improve the communication experience of hard of hearing persons across diverse public and private settings.

It should be noted that the positioning of the various connection sites for inputs and outputs, the location and configuration of controls, and the placement of components in and on the units can be re-arranged without affecting the system's capabilities or the claims made in the present patent application. In addition, the system can operate via AC/DC current, batteries, or wireless power sources; the functions of the system can be accomplished via solid state hardwired circuitry or via microprocessors hosting computer software, or both. And finally, the system can operate as a single unit, as connected units, as table top units or fixed arrangements by themselves or in connection with, embedded in or co-located with, other technological devices.

Note:

It is to be understood that the present invention is not limited to the embodiments described above, but encompasses any and all embodiments within the scope of the following claims.

We claim:

1. A communication system, comprising:

a plurality of connected portable hearing-assistive electronic units, each unit having a set of controls that can be operated by a user of the unit and a headset equipped with a directional microphone and headphones that can be worn by the user of the unit; each unit being capable of receiving, transmitting, amplifying and simultaneously sending multiple audio signals to and from the users of the connected units, enabling users to hear selected multiple audio signals coming into the connected units at the same time;

wherein said users are selected from the group consisting of persons who are hard of hearing and persons who have ordinary hearing;

said multiple audio signals being selected from the group comprising a signal from each user's voice being transmitted from the directional microphone located in his/her headset and signals from any other source of audio input coming into the connected units;

each signal being systematically routed through an amplifier to a set of controls located on each unit, such that each signal has its own designated control for adjusting its volume among the set of controls located on each unit;

enabling the user of each unit to separately adjust the volume of each audio input coming into the connected units as desired, whereby a personally blended signal of the volume-adjusted audio inputs is created for each user and routed to each user's headphones;

allowing the users to share the multiple audio inputs coming into the connected units while at the same time allowing them to adjust the volumes of said multiple audio inputs relative to one another;

allowing the users to wear headsets while talking with each other and listening to another source of audio input at the same time;

enabling the hard of hearing user to match the volume of his/her own voice to the volumes of the other voice inputs coming into the connected units and to turn up the volume of any of the voice inputs coming from the other users relative to the volume of any audio inputs coming from other sources of sound into the connected units;

an electrical connection, the "user connector", which connects the headset of each user to his/her connection site on one of the connected units;

receivers on each of the units capable of receiving audio input signals from the voice of each user and from another source of audio input into one or more of the connected units;

an electrical connection, the "inter-unit connector", which transmits audio signals coming into any connected unit, back and forth between the other connected units;

an electrical circuit that separately routes each audio input signal coming into any of the connected units through an amplifier connected to the set of controls on the unit;

the sets of controls allowing users of each unit to separately and continuously adjust the volume of each audio input signal coming into the unit as he/she desires;

the volume-adjusted audio input signals then being routed by the electrical circuit from the amplifier through an audio signal combiner which combines all of the audio input signals that have been volume-adjusted by each user into a separate combined set of audio output signals for each unit, each set maintaining the relative volumes of the audio signals making up the set as personally adjusted by each user;

and each combined set of audio output signals being sent back to the headphones of each respective user via the user connectors;

whereby resulting in an improved listening experience for users who are hard of hearing;

whereby the hard of hearing user does not feel the need to raise his/her voice to an unpleasant level while using the system since he/she can hear his/her own voice as well as the other voice inputs that have been volume-adjusted using his/her set of controls and as the hard of hearing user can turn up the volume of each of the user voice inputs over the volume of the audio inputs coming from any other sources of sound until he/she can hear the inputs from the voices of all the users as clearly as possible;

whereby resulting in an improved listening experience for users having ordinary hearing; and whereby the user with ordinary hearing does not have to raise his/her voice to an uncomfortable level in order to be heard by the hard of hearing user during the period of use.

2. The system according to claim 1:

wherein an omnidirectional microphone, located on the unit, can send an input signal into the unit that is routed by the electrical circuit through the amplifier connected to the set of controls, thereby allowing the user to differentially adjust the volume of the input signal from the omnidirectional microphone, which picks up sounds from the external environment, relative to other input signals into the unit, thereby allowing the user to hear sounds from the space around him/her even while he/she is wearing headphones and using the unit to listen to other audio inputs, and allowing the user to hear the voices of other users who are not wearing headsets having an attached directional microphone.

3. The system according to claim 1:

wherein the unit can continuously transmit an output signal consisting of a combination of all of the input signals into the unit through a speaker which projects the sounds into the room, in addition to routing each input signal through the user connection site and into the headphones of each participant user, thereby allowing users who are not wearing headphones to hear the multiple audio inputs going into the connected units.

4. The system according to claim 1:

wherein a control panel on each of the units consists of controls to adjust the volume of each audio input, along with one or more additional controls which allow the user to select specific persons to have a private conversation with, to block other persons from participating in a specific conversation, to put a specific conversation on "hold", and to signal when the user wants to get the attention of another person; and wherein the control panel has lights to indicate what specific persons have been selected to have a private conversation with, what specific persons are blocked from a private conversation, whether certain persons have been placed on hold, or whether the user wants to get the attention of another person connected to the system.

5. The system according to claim 1:

wherein one or more of the units are pre-programmed to separate out sound tracks from a single source of audio input and to route said separate audio tracks through the connected units, enabling the users to separately and continuously adjust the volume of each track relative to the other tracks from that single source, along with any other audio inputs into the system, creating a personal blend of the volume-adjusted audio inputs which is sent to the users' headphones while they are using the system to talk to each other and listen to another source of audio input at the same time.

6. The system according to claim 1:

wherein a digital screen and a keyboard are combined with one or more of the units, making the unit capable of receiving and sending audio and visual signals, along with speech, to and from the unit;

wherein the unit has an electrical circuit that separately and continuously routes audio and visual input signals to a connection site of the user;

wherein said visual signals are projected onto the digital screen, and said audio signals are routed through the connection site and sent on to the headset of each user;

wherein audio-visual controls are projected onto the screen of the unit allowing the user to select a source of audio-visual input while also separately and continuously adjusting the volume of each audio input into the unit;

wherein a set of personally volume-adjusted audio signals is sent to the user's headphones, and a set of unadjusted audio signals into the unit are sent to other persons;

wherein the user and other persons are enabled to simultaneously view synchronized visual and text input signals via a network while talking together, and the user with a keyboard combined with the unit can view and send text messages while talking with the other persons; and wherein hard of hearing users can differentially and continuously adjust the volume of each audio input into the unit, thereby making it possible for him/her to turn up the volume of audio inputs as high as desired without disturbing other participants and without requiring them to raise the volume of their voices in order to be heard.

7. The system according to claim 1:

wherein participants can use the hearing-assistive technology of the unit to enhance the hearing experience when using additional computer programs stored and processed within the unit.

8. The system according to claim 1:

wherein a recorder is used with the unit to enable the user to record an audiovisual program that can be replayed on the unit at a later time;

wherein the user can replay the audiovisual program while differentially and continuously adjusting the volume of each audio input coming into the unit, including audio input coming from the recording of the audiovisual program and audio inputs coming from the voices of other participants who are also viewing the recording while talking together with the user; and wherein a video recording can be synchronized with the audio track recording of an oral presentation accompanying a slide show or video.

9. The system according to claim 1:

wherein stationary units with fixed inputs located in a venue selected from the group comprising theaters, lecture halls and stadiums, are available for use by hard of hearing persons to access by plugging in a headset; and wherein outside connection sites allow the user to connect receptors on the portable unit to sources of audio input from the outside connection sites.

10. The system according to claim 1:

wherein an audio input signal from a telephone caller is connected and transmitted through the unit via the electrical circuit to the user and one or more other participants; allowing the user to separately and continuously adjust the volume of the caller's voice relative to the volume of other inputs into the unit, thereby sending a personally adjusted output signal to his/her headphones and an unadjusted audio output signal to the one or more other participants; allowing the user to talk with the telephone caller while also communicating with the one or more other participants in the room; and allowing said one or more other participants to assist the user with the telephone call.

11. The system according to claim 1, further comprising:

the units are built into a table top system and each of the units has a receiver for the audio input coming from a computer, and the audio input coming from a computer being connected to each unit, enabling the users to differentially adjust the volume of the computer audio input relative to any other audio inputs coming into the unit at the same time, thereby enabling the users to talk together while engaging in computer activities at the same time.

12. The system according to claim 1:

wherein the units can be used to facilitate communication while traveling in vehicles and talking to the other travelers at the same time;

wherein connection sites in vehicles allow the user to connect receptors on the unit to sources of audio input available wherever the vehicle is located; and wherein hearing-assistive technology of the system can be used to access other systems within the vehicle, which can be connected to the unit in the vehicle where the operator can differentially adjust both the audio signal from each selected source into the unit and voice input from other users traveling in the vehicle.

13. The system according to claim 1, wherein:

the users are selected from the group comprising persons physically present with the connected units and persons participating via remote transmission.

14. The system according to claim 1, further comprising:

one or more controls-only units, having more than one user connection site on the unit, and having the capacity to create more than one set of personally blended volume-adjusted audio inputs; and one or more passive units, each having a set of controls without the capacity of creating any set of personally blended volume-adjusted audio inputs;

thus enabling the user with the controls-only unit to plug her/her headset into one of the connection sites on the controls-only unit, and to plug the headsets of the users of the passive units into the remaining connection sites on the controls-only unit;

thereby allowing the users of both the controls-only units and the passive units to benefit fully from the hearing-assistive technology of the system.

15. The system according to claim 1, wherein:

the control panel on each unit consists of controls to adjust the volume of each audio input along with one or more additional controls to allow the user to select a sub-group of all of the persons connected to the units to have a separate conversation with, to signal that the user would like to join the conversation of an ongoing subgroup of persons using the units, and to make an announcement that can be heard by all users connected to the units; and the control panel has lights to indicate when certain subgroups of persons connected to the units are having a separate conversation, when a user would like to join the conversation of an ongoing subgroup of persons using the units, and when a user makes an announcement that can be heard by all users to the system.

16. The system according to claim 1, wherein:

the units are built into a table top where they are co-located and synchronized with an integrated large presentation screen and a teleconferencing system; and the input from the voice of each caller coming into the teleconferencing system and the input from the voice of each user who is wearing a headset and is physically present in the room with the teleconferencing system, are individually routed through the connected units to the set of controls on each unit, enabling said users to differentially adjust the volume of the voice inputs from each caller coming into the teleconferencing system as well as the volume of the voice inputs from each user who is physically present in the room, whereby creating an improved listening experience.

17. The system according to claim 1:

wherein hearing-assistive technology of the units can be co-located and synchronized with one or more other programmable electronic devices; and wherein controls on the other programmable electronic devices can be used to operate the hearing-assistive technology along with technology of the other devices.

18. A communication system, comprising:

a portable hearing-assistive electronic unit having a set of controls that can be operated by a user of the unit and a headset equipped with a directional microphone and headphones that can be worn by the user of the unit;

the unit being capable of receiving, transmitting, amplifying and simultaneously sending multiple audio signals to and from the user and persons who are communicating with the user, in such a way that the user can hear more than one of the selected multiple audio signals coming into the unit at the same time;

said multiple audio signals including a signal from the user's voice being transmitted from the directional microphone located in his/her headset and the signals from any other source of audio input coming into the unit;

each signal being systematically routed, through an amplifier located in the unit, to the unit's set of controls, such that each signal has its own designated control for adjusting its volume among the set of controls located on the unit;

wherein the user is able to separately adjust the volume of each audio input coming into the unit, creating a personally blended signal of the volume-adjusted audio inputs for the user that is routed to his/her headphones;

enabling the user to hear multiple audio inputs coming into the unit, while at the same time allowing him/her to adjust the volumes of said multiple audio inputs relative to one another; and enabling the user to wear a headset, while talking with another person via remote transmission of that other person's voice input, and listening to another source of audio input at the same time;

enabling a hard of hearing user to match the volume of his/her own voice to the volume of the other voice input coming into the unit and to turn up the volume of the voice inputs coming into the unit relative to the volume of any audio inputs coming from other sources of sound into the units;

resulting in an improved listening experience for users who are hard of hearing, as the hard of hearing user does not feel the need to raise his/her voice to an unpleasant level while using the system since he/she can hear his/her own voice as well as the other voice inputs that have been volume-adjusted using his/her set of controls and as the hard of hearing user can turn up the volume of the voice signal of the persons who are communicating with him/her over the volume of the audio inputs coming from any other sources of sound until he/she can hear the inputs from the voices as clearly as possible; and resulting in an improved listening experience for users having ordinary hearing and persons with ordinary hearing who are communicating with a user who is hard of hearing, as the user with ordinary hearing does not have to raise his/her voice to an uncomfortable level in order to be heard by the hard of hearing user during the period of use;

an electrical connection, the "user connector", which connects the headset of the user to his/her connection site on the unit;

receivers on the unit capable of receiving audio input signals from the voice of a person communicating with the user and from another source of audio input into the unit;

an electrical circuit that separately routes each audio input signal coming into the unit through an amplifier connected to the set of controls on the unit;

the set of controls allowing the user of the unit to separately and continuously adjust the volume of each audio input signal coming into the unit as he/she desires;

the volume-adjusted audio input signals then being routed by the electrical circuit from the amplifier through an audio signal combiner which combines all of the audio input signals that have been volume-adjusted by the user into a separate combined set of audio output signals, said set of audio output signals maintaining the relative volumes of the audio signals making up the set as personally blended by the user; and the combined set of audio output signals being sent back to the headphones of the user via the user connectors.

19. The system according to claim 18, wherein:

the unit is capable of separating out the sound tracks of a single audio input coming from one of a television and a telephone into the unit, and then routing the signal of each track from the single source through the unit to the set of controls on the unit, with the signal from each track having its own designated control for adjusting its volume among the set of controls, thereby allowing the user to differentially adjust the volume of the individual tracks from the single source of audio input along with any other audio inputs coming into the unit as desired in real-time so as to improve the listening experience.

* * * * *